United States Patent
Kim et al.

(10) Patent No.: US 9,229,057 B2
(45) Date of Patent: Jan. 5, 2016

(54) PATTERN SYNTHESIS APPARATUS AND SEMICONDUCTOR TEST SYSTEM HAVING THE SAME

(75) Inventors: Sung Yeol Kim, Gyeonggi-do (KR); In-su Yang, Gyeonggi-do (KR); Min Sung Kim, Seoul (KR); Jae Hyun Baek, Gyeonggi-do (KR); Jin-Kyu Choi, Gyeonggi-do (KR); Ho Sun Yoo, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 829 days.

(21) Appl. No.: 13/484,481

(22) Filed: May 31, 2012

(65) Prior Publication Data

US 2012/0326738 A1    Dec. 27, 2012

(30) Foreign Application Priority Data

Jun. 24, 2011    (KR) .................. 10-2011-0061483

(51) Int. Cl.
    *G01R 31/3183*    (2006.01)
(52) U.S. Cl.
    CPC .............. *G01R 31/318371* (2013.01)
(58) Field of Classification Search
    CPC  G11C 29/56; G11C 29/56012; G06F 11/263; G01R 31/31727; G01R 31/31922; G01R 31/31917; G01R 31/31919; G01R 31/318371
    See application file for complete search history.

(56) References Cited

U.S. PATENT DOCUMENTS

| | | | |
|---|---|---|---|
| 6,055,661 A * | 4/2000 | Luk | 714/736 |
| 6,617,842 B2 * | 9/2003 | Nishikawa et al. | 324/762.01 |
| 7,486,205 B2 * | 2/2009 | Wegener | 341/50 |
| 7,620,861 B2 * | 11/2009 | Lai et al. | 714/724 |
| 7,848,899 B2 * | 12/2010 | Lai et al. | 702/118 |
| 2006/0184726 A1 * | 8/2006 | Klint et al. | 711/105 |
| 2009/0300442 A1 * | 12/2009 | Choi et al. | 714/718 |
| 2011/0179324 A1 * | 7/2011 | Lai et al. | 714/723 |

FOREIGN PATENT DOCUMENTS

KR    20090125615 A    12/2009

* cited by examiner

*Primary Examiner* — Huy Q Phan
*Assistant Examiner* — James Split
(74) *Attorney, Agent, or Firm* — Harness, Dickey & Pierce, P.L.C.

(57) ABSTRACT

A semiconductor test system includes a user device configured to operate a reference device in accordance with an interface signal based on a timing signal having a variable operating frequency, a pattern synthesis apparatus configured to measure an interval between adjacent edges of the timing signal transmitted from the user device, and extract a logic value of the interface signal in accordance with the timing signal so as to generate test pattern data, and a test device configured to receive the test pattern data, reconstruct the timing signal based on the measured interval, generate a test driving signal such that the logic value is extracted from a device under test (DUT) based on the reconstructed timing signal, and apply the test driving signal to the DUT so as to determine an operating state of the DUT.

18 Claims, 19 Drawing Sheets

PATTERN SYNTHESIS APPARATUS AND SEMICONDUCTOR TEST SYSTEM HAVING THE SAME

CROSS-REFERENCE TO RELATED APPLICATIONS

This application claims priority under 35 U.S.C. §119 to Korean Patent Application No. 2011-0061483, filed on Jun. 24, 2011 in the Korean Intellectual Property Office (KIPO), the entire contents of which are incorporated herein by reference.

BACKGROUND

1. Field

Example embodiments of the inventive concepts relate to a pattern synthesis apparatus which determines pass or fail of a semiconductor device, and to a semiconductor test system having the same.

2. Description of the Related Art

Wafers are formed into complete devices through procedures including a fabrication (FAB) process and a subsequent post-process. The thus-formed devices are categorized into non-defective units and defective units by electrical, thermal and functional tests conducted during or after a packaging process. However, a memory module or device which is commercially available after having been determined to be a non-defective unit may not operate properly when mounted in a personal computer (PC) or a user device including for example a customer end (CE) device.

A semiconductor device to be tested is referred to as a device under test (DUT), and automatic test equipment (ATE), mounting-type test equipment, and fixed frequency mounting-type test equipment are used in testing the DUT.

The ATE tests the DUT using a test pattern based on a semiconductor integrated circuit (IC) defect model obtained through experimentation. The ATE, which may exhibit superior performance in detecting logical failures and parametric failures, however, may be unreliable in terms of accuracy and ease of detection when detecting failures in an actual operation environment. For example, the ATE may have limits in detecting failure patterns in a user device.

The mounting-type test equipment may test the DUT under simulated test conditions of an actual operation environment. In the case of a PC, the mounting-type test equipment may perform a test after fitting the DUT into a socket on a motherboard, thus performing the test in a relatively easy manner. However, when the DUT is welded to a printed circuit board (PCB), a socket may be required to be coupled to the DUT, which may cause distortion in an actual operation environment. Moreover, test patterns applicable to the DUT may be restricted, and the range of the test condition simulation may thus be limited.

The fixed frequency mounting-type test equipment may capture signals input to/output from a semiconductor device in a user device, which operates at a fixed frequency, receives data based on the captured signals, and tests the DUT based on the data. The fixed frequency mounting-type test equipment may provide advantages of both the ATE and the mounting-type test equipment.

However, electronic products with semiconductor devices which are actively variable in operating frequency are increasingly used recently, for example, to satisfy user demand for low power consumption and elongated life of electronic products. It may be desirable to have a semiconductor test system capable of testing pass or fail of semiconductor devices based on frequency variation.

SUMMARY

Example embodiments of the inventive concepts may provide a semiconductor test system including a pattern synthesis apparatus to measure an interval of a timing signal having a variable operating frequency using an interface signal of a user device mounted with a DUT which operates in accordance with the timing signal, and extract a logic value of the interface signal based on the measured interval to generate test pattern data, and a test device to reconstruct the timing signal and a driving signal based on the test pattern data, and apply the reconstructed timing signal and driving signal to the DUT.

Example embodiments of the inventive concepts may provide a pattern synthesis apparatus to measure an interval of a timing signal having a variable operating frequency using an interface signal of a user device which operates a semiconductor device in synchronization with the timing signal, and extract a logic value of the interface signal to generate test pattern data.

Additional aspects of example embodiments of the inventive concepts will be set forth in part in the description which follows and, in part, will be obvious from the description, or may be learned by practice.

In accordance example embodiments of the inventive concepts, a semiconductor test system may include a user device to operate a device under test (DUT) in accordance with an interface signal synchronized with a timing signal having a variable operating frequency, a pattern synthesis apparatus to measure an interval between adjacent ones of edges of the timing signal transmitted from the user device, and extract a logic value of the interface signal in accordance with the timing signal so as to generate test pattern data, and a test device to receive the test pattern data, reconstruct the timing signal based on the measured interval, generate a test driving signal such that the logic value is extracted in synchronization with the reconstructed timing signal, and apply the test driving signal to the DUT so as to determine an operating state of the DUT.

The pattern synthesis apparatus may include a time interval measurer to measure the interval between the adjacent edges of the timing signal, and count a sequence number of the measured interval to generate timing data, and a logic value capturer to generate a strobe signal based on the timing signal, and extract the logic value of the interface signal in accordance with the strobe signal.

The time interval measurer may determine, based on the measured interval, whether a timing event has occurred, and stores the timing data, the timing data including an interval and an interval sequence number corresponding to an occurrence of the timing event.

The timing event may include any one of a frequency change or duty ratio change, wherein the time interval measurer calculates a present period or a present duty ratio based on the interval, and determines the timing event to have occurred if a difference between the present period or present duty ratio and a reference value exceeds a predetermined threshold value.

The reference values may be a reference period or reference duty ratio calculated through an interval of most recently stored timing data, or a reference period or reference duty ratio calculated through an average of intervals measured from a most recent time where the timing data is stored to a present time.

The pattern synthesis apparatus may further include a control signal generator to generate an operating signal based on the logic value of the interface signal, the operating signal including information on whether an operating command is a read command or a write command, and generate an input/output enable signal based on the operating signal, the input/output enable signal including information on effective input/output timing between the test device and the DUT.

The timing signal may include a clock signal and a data strobe signal, the data strobe signal being generated for a predetermined period according to the write command or the read command, and the interface signal includes a data signal, a command signal and an address signal.

The logic value capturer may include a strobe generator to generate the strobe signal based on the timing signal, the strobe signal including information regarding effective timing to capture the logic value of the interface signal, a command/address signal capturer to extract logic values of the command signal and the address signal using the generated strobe signal, and a data signal capturer to extract a logic value of the data signal using the generated strobe signal.

The strobe generator may detect the edges of the timing signal, and generates the strobe signal at each of the detected edges, the strobe signal being delayed by a predetermined time in accordance with a predetermined format.

The strobe generator may detect edges of the clock signal and generates a clock strobe signal at each of the detected edges, detects edges of the data strobe signal and generates at least one write strobe signal at each of the detected edges, and generates at least one read strobe signal at a position delayed by a predetermined period from the generated write strobe signal.

The command/address signal capturer may extract the logic values of the command signal and address signal corresponding to a position of the clock strobe signal based on the clock strobe signal.

The data signal capturer may extract the logic value of the data signal based on at least one of the clock strobe signal, the write strobe signal and the read strobe signal in accordance with the predetermined format, and selects the extracted logic value based on the operating signal.

The data signal capturer may extract the logic value of the data signal corresponding to a position of each of the clock strobe signal, the write strobe signal and the read strobe signal based on the clock strobe signal, the write strobe signal and the read strobe signal, and selects the logic value based on the operating signal, the logic value being extracted based on at least one of the clock strobe signal, the write strobe signal and the read strobe signal.

The test device may include one or more test boards interconnected in a ring topology.

Each of the test boards may include a timing generator to generate the timing signal using timing data, the timing data including the interval between the adjacent edges and a sequence number of the interval.

The timing generator may generate the timing signal in any one of a first mode and a second mode, wherein the timing generator generates the timing signal in accordance with a timing set table in the first mode, the table including, by indices, information on a period of the timing signal and positions of edges in the period, wherein the timing generator generates the timing signal based on the timing data in the second mode, the edges of the timing signal being adjusted in position in accordance with a predetermined format.

The timing generator in the first mode may set an index value based on a type of the timing signal to be generated and the timing data, and generates the timing signal based on data of the timing set table corresponding to the index value.

The timing generator in the second mode may generate a clock signal based on the timing data, the clock signal being the timing signal, and, when the timing signal is not the clock signal, generates the timing signal based on the timing data and control data, the control data including information regarding positions of edges in a predetermined period of the timing signal to be generated.

The timing generator in the second mode may include a timing set generator to generate a timing set using the timing data and the control data, the timing set including the information on the period of the timing signal and the edge positions in the period, and a timing waveform generator to generate the edges of the timing signal based on the generated timing set so as to generate the timing signal.

Each of the test boards may further include a waveform generator to output a waveform of a driving signal based on waveform configuration information in synchronization with the timing signal, the waveform configuration information including information on a position where the logic value is extracted and information on a position of a transition between high and low levels.

The driving signal may include wherein the driving signal includes a command signal, an address signal and a data signal, wherein the waveform generator generates the waveform such that logic values of the command signal and address signal are extracted at rising and falling edges of a clock signal to enable the command signal and the address signal to be synchronized with the clock signal, the clock signal being the timing signal, and the transition is made at a center of the clock signal.

The waveform generator may generate the waveform such that a logic value of the data signal is extracted at each of the rising and falling edges of the clock signal or a rising edge or a falling edge of a data strobe signal and the transition is made at a center of the clock signal or data strobe signal.

The waveform generator may generate the waveform generator generates the waveform such that the data signal is synchronized with the data strobe signal in a duration in which a write command is generated, and is synchronized with the clock signal in other durations.

Each of the test boards may further include a pattern distributor to distribute the test pattern data to components of the test board, wherein the pattern distributor operates in any one of a first mode and a second mode, wherein the pattern distributor distributes the test pattern data directly to the respective components of the test board in the first mode, wherein, in the second mode, the pattern distributor filters only effective data among the test pattern data, the effective data including a predetermined command signal and data associated with the command signal, rearranges the effective data in accordance with an order format of the predetermined command signal, and distributes the rearranged data to respective components of the test board.

The semiconductor test system may further include a pin electronics unit to output a test driving signal to the DUT only when a DRE signal is activated, the test driving signal being converted from the driving signal transmitted from the waveform generator to have a voltage level recognizable by the DUT, the DRE signal including information regarding effective timing to output the test driving signal; and a pattern comparator to extract a logic value of a DUT response signal output from the DUT, compare the logic value and predetermined expected data, and determine the operating state of the DUT in accordance with the result of the comparison, the comparison between the logic value and the expected data being performed only when a CPE signal is activated, the CPE signal including information on effective timing for comparison.

The semiconductor test system may further include a storage server to store the test pattern data generated by the pattern synthesis apparatus in real time, wherein the test device receives at least one test pattern data from the storage server in real time.

In accordance with example embodiments of the inventive concepts, a pattern synthesis apparatus may generate test pattern data using an interface signal in a user device, the user device operating a DUT in synchronization with a timing signal having a variable operating frequency. The pattern synthesis apparatus may include a time interval measurer to measure an interval between adjacent edges of the timing signal, and count a sequence number of the measured interval to generate timing data, and a logic value capturer to generate a strobe signal based on the timing signal, and extract a logic value of the interface signal in accordance with the strobe signal.

The time interval measurer may determine, based on the measured interval, whether a timing event has occurred, and stores the timing data, the timing data including an interval and an interval sequence number corresponding to an occurrence of the timing event.

The time interval measurer may include an edge detector to detect rising and falling edges of a clock signal, a timing data generator to measure an interval between the detected rising and falling edges, and counts a sequence number of the interval so as to generate timing data, a timing event checker to determine, based on the interval, whether the timing event has occurred, the timing event changing the frequency or a duty ratio, and a filter to filter the timing data if the timing event has not occurred.

The timing event checker may calculate a present period or a present duty ratio based on the interval, and determines the timing event to have occurred if a difference between the present period or present duty ratio and a reference value exceeds a predetermined threshold value.

The reference values may be a reference period or reference duty ratio calculated through an interval of most recently stored timing data, or a reference period or reference duty ratio calculated through an average of intervals, the intervals being measured from a most recent time when the timing data is stored to a present time.

The timing event checker may store the average of intervals as timing data.

The pattern synthesis apparatus may further include a control signal generator to generate an operating signal based on the logic value of the interface signal, the operating signal including information on whether an operating command is a read command or a write command, and generate an input/output enable signal based on the operating signal, the input/output enable signal including information on effective input/output timing between the test device and the DUT.

The timing signal may include a clock signal and a data strobe signal, the data strobe signal being generated for a predetermined period according to the write command or the read command, and the interface signal includes a data signal, a command signal and an address signal.

The logic value capturer may include a strobe generator to generate the strobe signal based on the timing signal, the strobe signal including information regarding effective timing to capture the logic value of the interface signal, a command/address signal capturer to extract logic values of the command signal and the address signal using the generated strobe signal, and a data signal capturer to extract a logic value of the data signal using the generated strobe signal.

The strobe generator may detect the edges of the timing signal, and generate the strobe signal at each of the detected edges, the strobe signal being delayed by a predetermined time in accordance with a predetermined format.

The strobe generator may detect edges of the clock signal and generate a clock strobe signal at each of the detected edges, detect edges of the data strobe signal and generate at least one write strobe signal at each of the detected edges, and generate at least one read strobe signal at a position delayed by a predetermined period from the generated write strobe signal.

The strobe generator may check an interval of the clock signal to which generation time point of the write strobe signal belongs, and generate the read strobe signal at a position delayed by a half of the interval from the generation time point of the write strobe signal.

The command/address signal capturer may extract extracts the logic values of the command signal and address signal corresponding to a position of the clock strobe signal based on the clock strobe signal.

The data signal capturer may extract the logic value of the data signal based on at least one of the clock strobe signal, the write strobe signal and the read strobe signal in accordance with the predetermined format, and selects the extracted logic value based on the operating signal.

The data signal capturer may extract the logic value of the data signal corresponding to a position of each of the clock strobe signal, the write strobe signal and the read strobe signal based on the clock strobe signal, the write strobe signal and the read strobe signal, and selects the logic value based on the operating signal, the logic value being extracted based on at least one of the clock strobe signal, the write strobe signal and the read strobe signal.

The data signal capturer may select the logic value extracted based on the read strobe signal when the operating signal of the read command is generated, selects the logic value extracted based on the write strobe signal when the operating signal of the write command is generated, and selects the logic value extracted based on the clock strobe signal when the operating signal is not generated.

The logic value extracted based on the read strobe signal may be stored as expected data, the expected data being a reference value for determining an operating state of the DUT.

The input/output enable signal may include a DRE signal and a CPE signal, the DRE signal including information regarding effective timing to output a test driving signal from the test device to the DUT, the CPE signal including information regarding effective timing to compare a logic value of a DUT response signal and expected data, the DUT response signal a result of the test driving signal applied to the DUT.

The pattern synthesis apparatus may be connected to an event generator, the event generator generating and transmitting a pulse signal when a predetermined event is performed by the user device.

The pattern synthesis apparatus may further include an event checker to generate event information data when the pulse signal is transmitted, the event information data including a generation time point of the pulse signal and a type of the event.

A semiconductor test system according to example embodiments of the inventive concepts may include a pattern synthesis apparatus configured to receive an interface signal from a reference semiconductor device, generate timing data by measuring intervals of a timing signal associated with the reference device, extract logic values from the interface signal, and generate test pattern data based on the extracted logic values; and a test device configured to receive the test pattern data and the timing data, reconstruct the timing signal based on the timing data, generate a test driving signal based on the test pattern data and the reconstructed timing signal, apply the test driving signal to a device under test (DUT) to generate test output data, and to determine an operating state of the DUT based on the test output data and the extracted logic values.

The semiconductor system may further include a user device including a board, and the reference semiconductor device, the reference semiconductor device being mounted on the board, the interface signal being a signal sent between the board and the reference semiconductor device.

The extracted logic values may include commands sent to the reference semiconductor device from the board, and data output from the reference semiconductor device, and the pattern synthesis device may be configured to store the data output from the reference semiconductor device as expected data.

The test device may be configured such that determining the operating state of the DUT includes generating a comparison result based on the test output data and the expected data, and determining the operating state of the DUT based on the comparison result.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
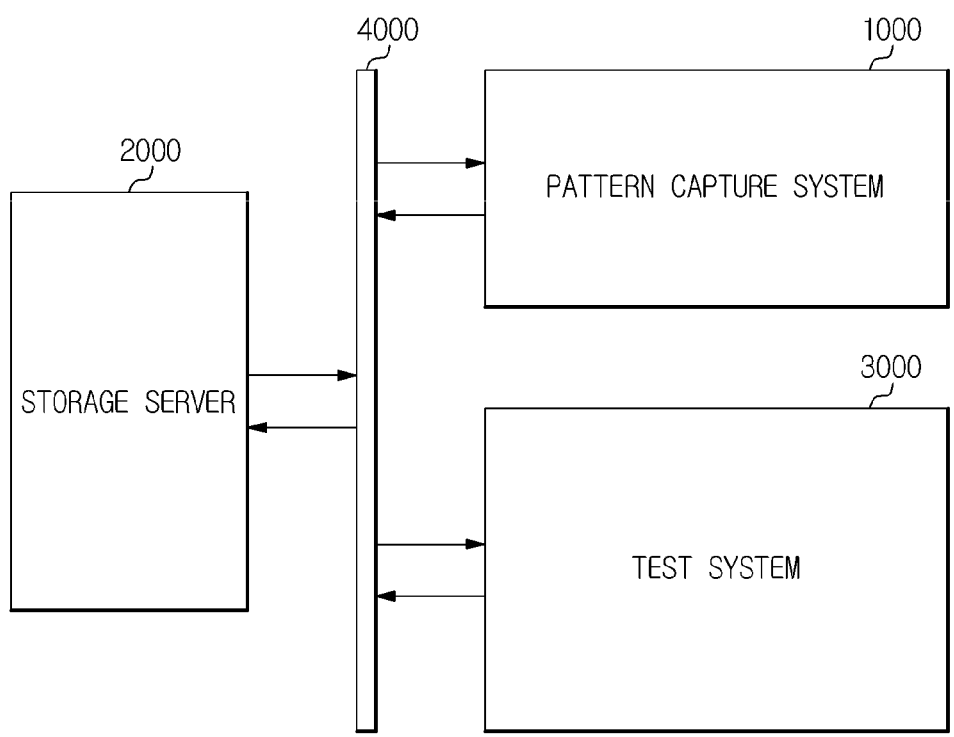
FIG. 1 is a block diagram schematically showing a configuration of a semiconductor test system according to example embodiments of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram schematically showing a configuration of a semiconductor test system according to example embodiments of the inventive concepts.

Referring to FIG. 1, the semiconductor test system according to the present embodiment may include a pattern capture system 1000, a storage server 2000, a test system 3000 and a data communication link 4000.

The pattern capture system 1000 may capture a signal for test logic from a user device, and synthesizes a test pattern using the captured signal.

For example, in the pattern capture system 1000, a pattern synthesis apparatus may be connected with the user device. The user device may have a reference semiconductor device mounted therein, which is of the same type as (or is compatible) with a device under test (DUT) to be tested, to capture all signals of the semiconductor device.

The storage server 2000 may store test pattern data transmitted from the pattern capture system 1000. In addition, the storage server 2000 may transmit data required by the test system 3000 during a DUT test.

For example, the storage server 2000 may store various test pattern data captured by the pattern capture system 1000 in real time, and, as needed, search the stored data for appropriate information and transmit the information to the test system 3000 in real time.

In addition to storing the test pattern data, the storage server 2000 may check and correct an error in the test pattern data. In addition, the storage server 2000 may be used for simple data backup or as a database.

The storage server 2000 may include a plurality of storage servers depending on the transmission bandwidth and capacity of the test pattern data.

The storage server 2000 may include an optical transceiver to input/output data through the data communication link 4000 so as to, for example, communicate with an external device, a bus adaptor for bus compatibility between the optical transceiver and the storage server 2000, and an internal central processing unit (CPU), a memory and a redundant array of independent disks (RAID) for data buffering and transfer.

The storage server 2000 may be connected with an external controller such that the storage server 2000 and the external controller communicate with each other through a local area network (LAN) or the like. The controller may set operation parameters of the storage server 2000 and control and monitor the overall operation thereof.

In the test system 3000, a test device may be connected with the DUT to apply a test signal to the DUT and determine pass or fail of the DUT based on an output waveform of the DUT in response to the test signal.

The test system 3000 may receive test pattern data from the storage server 2000 in real time, generate a signal waveform to test the DUT based on the received test pattern data, and apply the signal waveform to the DUT. The test device may restore the test pattern data, apply the restored data to the DUT, detect a logic value of a DUT response signal output from the DUT, and determine the operating state of the DUT based on the detected logic value.

For example, the test device may compare expected data restored from the test pattern data and the logic value extracted from the signal output from the DUT, and determine whether the operation of the DUT is normal or abnormal in accordance with a comparison result. For example, the DUT may be determined to pass if the logic value is identical to the expected data, and fail if the logic value is different from the expected data.

The data communication link 4000 may perform data transmission/reception among the pattern capture system 1000, the test system 3000 and the storage server 2000.

The data communication link 4000 may be composed of a plurality of high-speed optical cables to ensure high or higher transmission bandwidth, and may further include a switch.

In this case, the switch of the data communications link 4000 may interconnect the pattern capture system 1000 and the test system 3000 via the storage server 2000. For example, the pattern capture system 1000 and the storage server 2000 may be interconnected via the data communication link 4000. Further, the test system 3000 and the storage server 2000 may be interconnected via the data communication link 4000. Thus, according to example embodiments of the inventive concepts, the test pattern data transmitted from the pattern capture system 1000 may be stored in the storage server 2000, and certain test pattern data may be selected from among the stored test pattern data and transmitted to the test system 3000 over the data communication link 4000.

Although, in the example illustrated in FIG. 1, the semiconductor test system has been configured to include the storage server 2000, according to example embodiments of the inventive concepts the pattern capture system 1000 and the test system 3000 may be directly interconnected through the data communication link 4000 without the storage server 2000. Thus, test pattern data from the pattern capture system 1000 may be transmitted to the test system 3000 in real time to be used in the DUT test.

According to example embodiments of the inventive concepts, the semiconductor test system may capture a pattern of an interface signal applied to the semiconductor device in the user device which is variable in frequency, and apply the captured pattern to the DUT to test pass or fail of the semiconductor device based on frequency variation.

Now, configurations of the pattern capture system 1000 and test system 3000 to test pass or fail of the semiconductor device based on frequency variation will be explained in detail.

Figure 2:
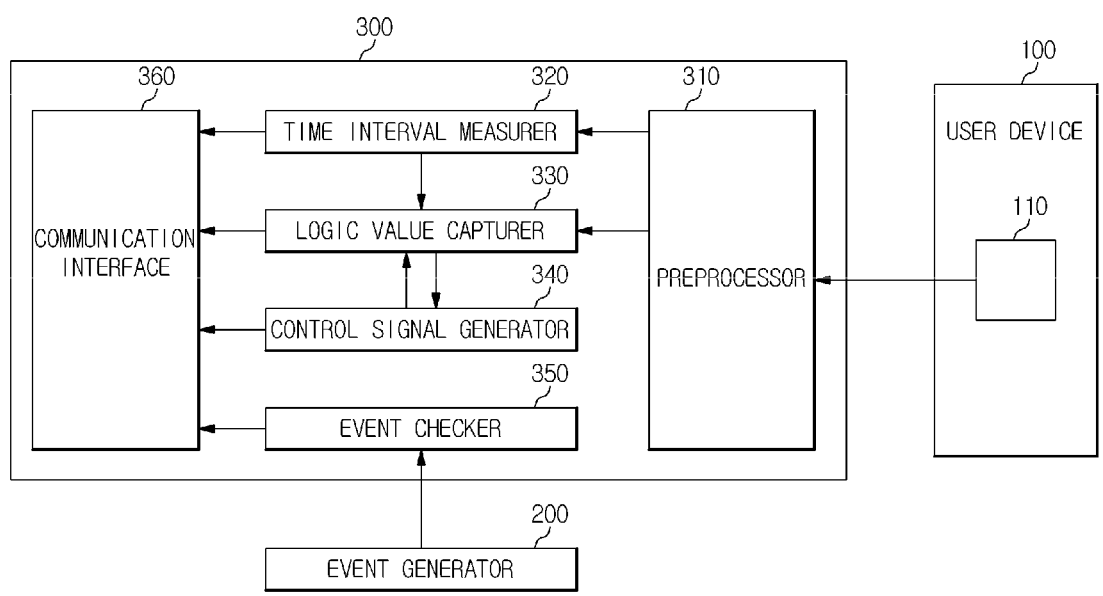
FIG. 2 is a block diagram showing a configuration of a pattern capture system in detail.

FIG. 2 is a block diagram showing a configuration of the pattern capture system 1000 in detail.

Referring to FIG. 2, the pattern capture system 1000 according to example embodiments of the inventive concepts may include a user device 100, an event generator 200 and a pattern synthesis apparatus 300.

The user device 100 may be mounted with a reference semiconductor device of the same type as or compatible with a DUT to be tested. Here, the semiconductor device may be a memory device including for example a dynamic random access memory (DRAM), and the user device 100 may be a mobile phone, a gaming machine, a computer or the like having such a semiconductor device.

The user device 100 may transmit an interface signal of the semiconductor device to the pattern synthesis apparatus 300 through a probe 110. For example, all signals to drive the semiconductor device may be transmitted to the pattern synthesis apparatus 300, and finally used in generating test pattern data.

The probe 110 may transfer the interface signal to the pattern synthesis apparatus 300 in such a manner as to minimize distortion of the interface signal. To this end, the probe 110 may include an interposer, a cable and a fixing member.

Figure 3:
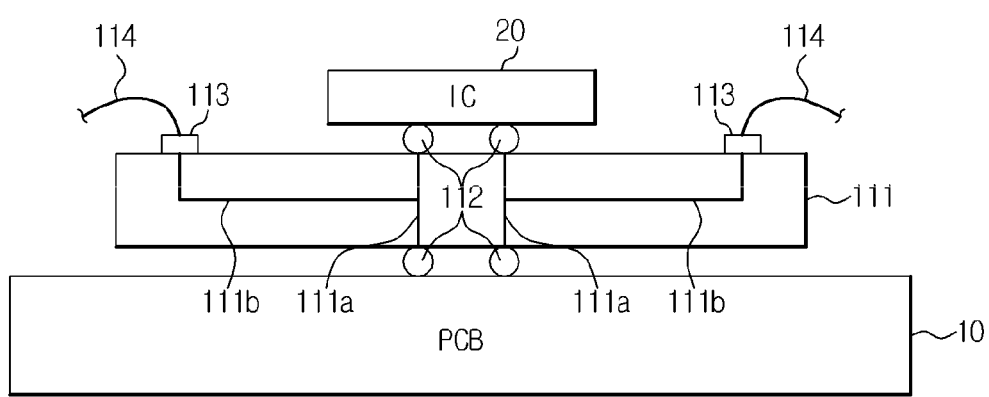
FIG. 3 is a diagram illustrating a connection structure between a probe and a semiconductor device in a user device.

The probe 110 and the semiconductor device in the user device 100 may be interconnected as shown in FIG. 3.

FIG. 3 is a diagram illustrating a connection structure between a probe and a semiconductor device in a user device.

Referring to FIG. 3, an interposer 111 may be fixed between a PCB 10 and a semiconductor device (IC) 20 through a fixing member 112.

The interposer 111 may have a signal path formed therein, which includes main paths 111a serving as signal paths between the PCB 10 and the reference semiconductor device 20, and additional paths 111b connected respectively to the main paths 111a to transfer signals to cables 114. In addition, resistors 113 may be connected respectively between the additional paths 111b and the cables 114. Here, each resistor 113 may have a resistance that is, for example, ten or more times an impedance of each main path 111a.

As signals are transmitted to the cables 114 after passing through the resistors 113 each having a relatively high resistance, signal distortion along the main paths 111a may be reduced or minimized, and a signal, only an amplitude of which is attenuated, may be probed among the signals on the main paths 111a.

The event generator 200 may generate an electrical pulse signal at an occurrence time of a specific operation (event) of the user device 100, and transmit the signal to the pattern synthesis apparatus 300. Accordingly, when the specific operation is performed, test pattern data for the signal of the user device 100 may be generated or the occurrence time of the specific operation may be recorded in the generated test pattern data.

The event generator 200 may include a signal generator to generate a signal when the specific operation is performed, and a cable to transfer the generated signal to the pattern synthesis apparatus 300. The signal generator may be composed of a timer or a switch, and may generate a pulse signal when a specific timer condition is satisfied or when the switch is activated.

Although the semiconductor test system according to example embodiments of the inventive concepts has the event generator 200 as a separate component, it may be possible to incorporate the event generator 200 into the user device 100 to generate a pulse signal for every occurrence of a specific operation of the user device 100. For example, a processor of the user device 100 may generate a signal, and the generated signal may be transmitted to the pattern synthesis apparatus 300 through an input/output (IO) line connectible to an external device. In this case, the event generator 200 may be realized through firmware to generate an electric signal via the input/output (IO) line at every occurrence time of a specific operation.

The pattern synthesis apparatus 300 may synthesize mounting-type test pattern data based on signals transmitted respectively from the probe 110 and the event generator 200. Specifically, the pattern synthesis apparatus 300 according to example embodiments of the inventive concepts may measure timing of an interface signal probed by the probe 110, and capture a logic value of the interface signal synchronized with the measured timing.

Thus, the pattern synthesis apparatus according to example embodiments of the inventive concepts may synthesize test pattern data to test pass or fail of a semiconductor device based on frequency variation.

A configuration of the pattern synthesis apparatus 300 which may capture a signal waveform from a DRAM as a semiconductor device to synthesize test patterns will be described in detail below. However, it will be readily understood by those skilled in the art that the present embodiment is also applicable to the case of synthesizing test patterns of any semiconductor device other than the DRAM, the operating frequency of which may vary depending on conditions.

In the example illustrated in FIG. 2, the pattern synthesis apparatus 300 according to the present embodiment includes a preprocessor 310, a time interval measurer 320, a logic value capturer 330, a control signal generator 340, an event checker 350 and a communication interface 360.

The interface signal of the DRAM transferred through the probe 110 may be transmitted to the time interval measurer 320 and the logic value capturer 330 through the preprocessor 310, and test pattern data generated by the time interval measurer 320 and logic value capturer 330 may be externally transmitted through the communication interface 360.

For example, the preprocessor 310 may amplify a signal with an attenuated amplitude, and compare the amplified signal with a predetermined value to convert the signal into a digital signal. In addition, the preprocessor 310 may send the converted digital signal to the time interval measurer 320 and logic value capturer 330.

The time interval measurer 320 may receive a timing signal from the preprocessor 310, and store timing data including a time interval and a sequence number of the timing signal in a memory of the pattern synthesis apparatus 300.

Although the time interval measurer 320 according to example embodiments of the inventive concepts may measure only the time interval of a clock signal which is a reference signal for a DRAM operation, it may also measure a time interval of any signal other than the clock signal.

The term "time interval" may refer to an interval between adjacent rising and falling edges of a clock signal, and the measured time interval may indicate whether an operating frequency has changed and the changed operating frequency if the operating frequency has changed, and a logic value of data may be captured based on the measured interval.

Particularly, the time interval measurer 320 according to example embodiments of the inventive concepts may store timing data in the memory corresponding to occurrence of a timing event instead of storing all measured timing data. For example, the time interval measurer 320 may compress and store only timing data corresponding to occurrence of a timing event instead of storing all measured timing data.

For example, the time interval measurer 320 may determine whether a timing event has occurred based on a measured interval, and store timing data corresponding to the occurrence of the timing event as representative timing data of a duration ranging from an occurrence time of the recent timing event to the present time.

For example, the time interval measurer 320 may continuously measure an interval between rising and falling edges of a clock signal so that an interval and a sequence number corresponding to the occurrence of the timing event may be stored as representative timing data so as to reduce the quantity of data stored.

Here, the timing event may refer to an event in which a frequency has changed, or a duty ratio which is a ratio between a high level duration and a low level duration in one period has changed.

Now, a configuration of the time interval measurer 320 and an example of a process of measuring an interval of a clock signal and calculating a sequence number thereof will be explained in detail with reference to FIG. 4 and FIG. 5.

Figure 4:
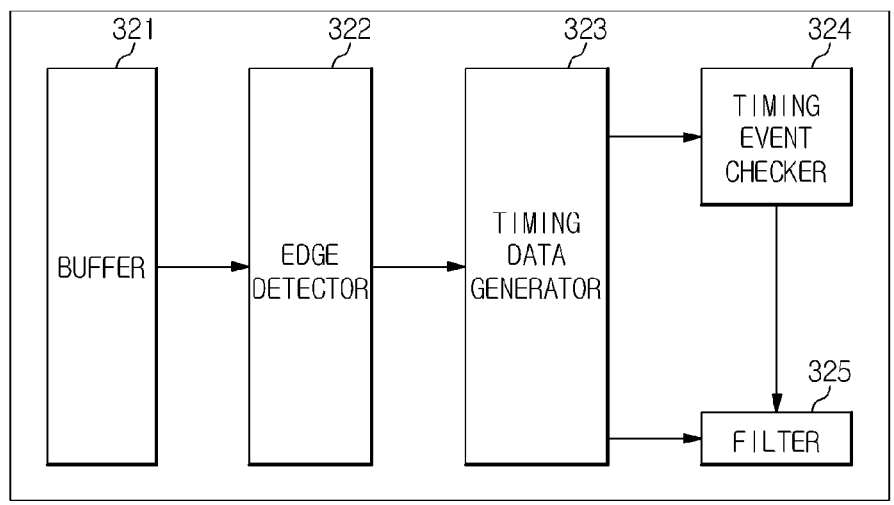
FIG. 4 is a block diagram showing a configuration of a time interval measurer shown in FIG. 2 in detail.

FIG. 4 is a block diagram showing a configuration of a time interval measurer shown in FIG. 2 in detail.

In the example illustrated in FIG. 4, the time interval measurer 320 includes a buffer 321 which may temporarily store a clock signal sent from the preprocessor 310, an edge detector 322 which may detect rising and falling edges of the clock signal stored in the buffer 321, a timing data generator 323 which may measure an interval between the detected rising and falling edges, and count a sequence number of the measured interval to generate timing data, a timing event checker 324 which may determine, based on the measured interval, whether a frequency or a duty ratio has changed, and a filter 325 which may filter the timing data when no timing event has occurred.

Figure 5:
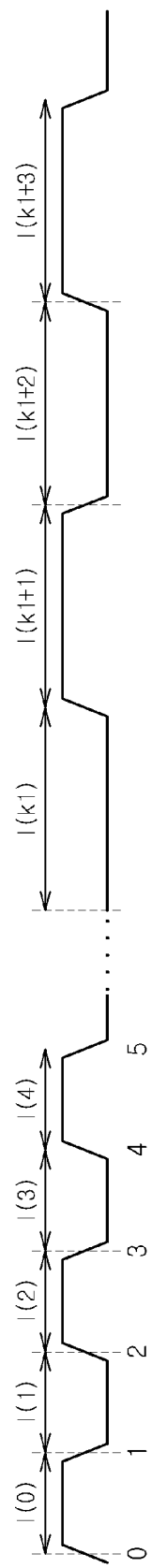
FIG. 5 is a timing diagram illustrating an example of timing data generated by the time interval measurer shown in FIG. 2.

FIG. 5 is a timing diagram illustrating an example of timing data generated by the time interval measurer shown in FIG. 2. For example, as shown in FIG. 5, the timing data generator 323 may measure an interval I(k) (k=0, 1, 2 . . . ) between a rising edge and a falling edge of the clock signal, and count an interval sequence number k whenever the interval is measured. The timing data generator 323 may set a sequence number to '0' for a first rising edge of the clock signal after the pattern synthesis apparatus 300 starts its operation, and may set sequence numbers by incrementing the sequence number by '1' for each edge. Referring to the example illustrated in FIG. 5, the sequence number is counted for every edge starting from '0', and an interval I(0) between an edge whose sequence number is '0' and an edge whose sequence number is '1' is measured.

The timing event checker 324 may calculate a present period based on the measured interval, and determine whether a frequency has changed based on a difference between the calculated present period and a reference period. Here, the reference period may be calculated through an interval of the most recently stored timing data.

For example, if the difference between the calculated present period and the reference period exceeds a predetermined or reference threshold value, it may be determined that a timing event has occurred, for example by the timing event checker 324, and present timing data (I(k) and k) may be stored in the memory.

Referring to FIG. 5, the timing event checker 324 may determine that a difference between a present period calculated through a k1th interval I(k1) and the reference period calculated through the interval I(0), which is the interval of the most recently stored timing data, has changed, and perform a control operation to store the value of the interval I(k1) and an interval sequence number k1 for the interval value I in the memory.

In addition, the timing event checker 324 may measure a present duty ratio based on the ratio between an interval value of a high level and an interval value of a low level within one period, and compare the measured present duty ratio and a reference duty ratio to determine whether there is a duty ratio change. Here, the reference duty ratio may be calculated through an interval of the most recently stored timing data.

For example, the timing event checker 324 may determine whether a difference between the present duty ratio and the reference duty ratio exceeds a predetermined or reference threshold value, and store present timing data (1(k) and k) in the memory if the difference exceeds the threshold value.

For example, the timing event checker 324 may calculate the present period and the present duty ratio based on the measured interval, and compare the calculated value and the reference value to determine whether a timing event has occurred.

In the example described above with reference to FIG. 5, only timing data corresponding to occurrence of a timing event is stored in the memory, and the timing data is filtered when no timing event has occurred. However, according to example embodiments of the inventive concepts, timing data corresponding to non-occurrence of a timing event may be used in recalculating the reference value. For example, the timing event checker 324 may recalculate the reference value, including for example, the reference period and the reference duty ratio, continuously and compare the reference value with the present period and the present duty ratio to determine whether a timing event has occurred.

Upon determining that no timing event has occurred, the timing event checker 324 recalculates the reference period and the reference duty ratio using a plurality of intervals measured from the most recent time where timing data is stored to the present time. The process of recalculating the reference period and the reference duty ratio is repeated until a timing event occurs.

For example, the timing event checker 324 calculates an average of the plurality of intervals measured from the most recent time where timing data is stored to the present time, and recalculates the reference period and the reference duty ratio through the calculated average interval. In addition, the timing event checker 324 may store the thus-calculated average interval as timing data.

Referring to FIG. 5, the timing event checker 324 may calculate an average interval value by reflecting all of the interval values measured from the interval I(0) to the interval I(k1-1) before the interval I(k1) where a timing event has occurred, and calculate a reference value based on the average value. Thus, the timing event checker 324 may store both an average value (I'(0)) of the values of intervals I(0) to I(k1-1) and a starting interval sequence number 0, as timing data.

For example, the timing event checker 324 may calculate an average interval value until a subsequent timing event has occurred, continuously, and finally store the calculated average value as timing data, instead of storing only the timing data corresponding to an occurrence time of a timing event. Thus, it may be possible to prevent erroneous interval information from being stored as timing data influenced by noise.

The logic value capturer 330 may receive an interface signal from the preprocessor 310 to capture the interface signal, and stores logic value data generated by capturing the interface signal in the memory.

Here, the interface signal may include, for example, a timing signal, a data signal, a command signal, an address signal, etc. In addition, the timing signal may be a primary timing-related interface signal including for example a clock signal, a data strobe signal, etc.

The logic value capturer 330 may extracts a logic value of '0' or '1' at each edge of a strobe signal depending on specifications of a semiconductor device, and transmit the extracted logic value to the control signal generator 340 and memory.

For example, the logic value capturer 330 may capture logic values of a command signal and an address signal included in the interface signal using a clock signal as a strobe (information on sampling timing). For example, a logic value of a double data rate (DDR) signal may be captured for every rising and falling edge of the clock signal, and a logic value of a single data rate (SDR) signal is captured for every rising edge of the clock signal. The thus-captured logic value data of the command signal may be transmitted to the control signal generator 340.

In addition, a logic value of a data signal may be captured using a data strobe signal or a clock signal as a strobe. For example, the logic value capturer 330 may capture logic data using a data strobe signal as a strobe in a read or write command duration, and capture a logic value using a clock signal as a strobe in any duration other than the read or write command duration, as no data strobe signal is generated in any duration other than the read or write command duration.

The logic value capturer 330 may store the data signal captured in accordance with a read command in the memory as expected data. The expected data may be compared with a logic value of a DUT response signal output from the DUT in a test device so as to serve as a reference value to determine pass or fail of the DUT.

The control signal generator 340 may generate an operating signal including information indicating whether an operation is an input operation to the DUT or an output operation from the DUT based on the output from the logic value capturer 330 and specifications of the DUT, and generate an input/output enable signal based on the operating signal.

For example, the control signal generator 340 may analyze logic data of the command signal transmitted from the logic value capturer 330 to determine whether the logic data is a read command or a write command, and generate an operating signal indicating a read operation or a write operation for every sequence number.

In addition, the control signal generator 340 may generate an input/output enable signal based on the generated operating signal. The input/output enable signal may serve to control a test device, and include a drive enable signal DRE which is, for example, information regarding an effective timing to output a signal from the test device to the DUT. The control signal generator 340 may compare enable signal CPE, which is, for example, information regarding an effective timing, to compare a signal output from the DUT and expected data.

Now, configurations of the logic value capturer 330 and control signal generator 340, and a process of processing each signal in the logic value capturer 330 and control signal generator 340 will be explained in detail with reference to FIG. 6 and FIG. 7.

Figure 6:
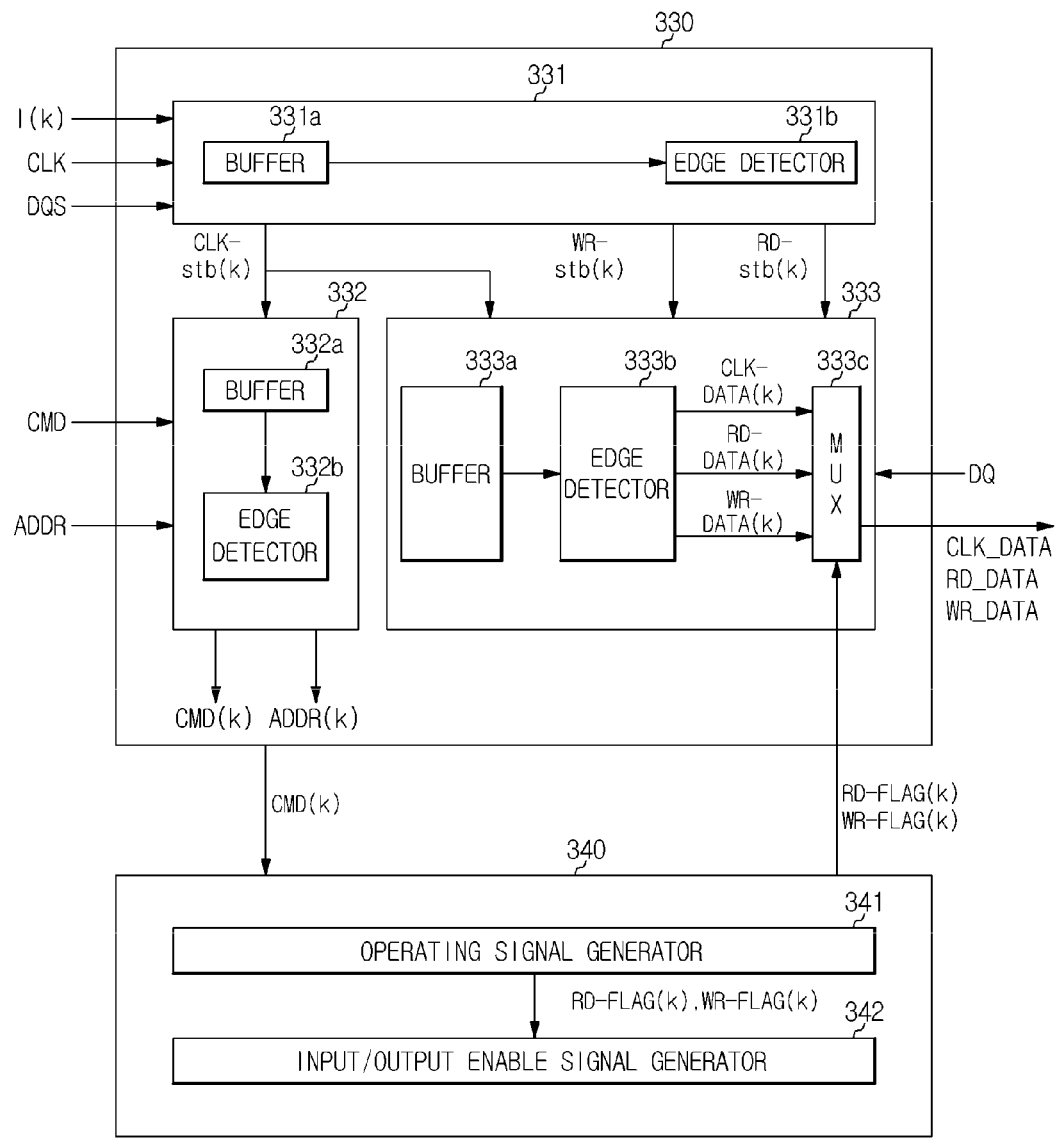
FIG. 6 is a block diagram showing configurations of a logic value capturer and a control signal generator in FIG. 2 in detail.

FIG. 6 is a block diagram showing configurations of a logic value capturer and a control signal generator in FIG. 2 in detail;

In the example illustrated in FIG. 6, the logic value capturer 330 includes a strobe generator 331 to generate a strobe signal which is information regarding effective timing to capture a logic value of an interface signal, and a signal capturer (not shown) to extract a logic value of each interface signal using the strobe signal.

Here, the interface signal according to example embodiments of the inventive concepts may include a command signal CMD, an address signal ADDR which is, for example, an address where an operation is performed in accordance with the command signal, and a data signal DQ. Accordingly, the signal capturer may include a command/address signal capturer 332 to capture logic values of the command signal CMD and a DRAM cell address signal ADDR, and a data capturer 333 to capture a logic value of the data signal DQ.

The control signal generator 340 may include an operating signal generator 341 to analyze logic value data of the command signal generated by the command/address signal capturer 332, generate an operating signal RD_FLAG or WR_FLAG indicating whether a command is a read command or a write command, and transmit the operating signal to the data capturer 333, and an input/output enable signal generator 342 to generate the input/output enable signal DRE/CPE which is, for example, information regarding effective input/output timing, based on the generated operating signal.

The strobe generator 331 may detect edges of the timing signal included in the interface signal, and generate a strobe signal at each detected edge or a strobe signal delayed by a predetermined or reference time from each detected edge according to specifications of the DUT.

For example, the strobe generator 331 may generate a strobe signal which is logic value capture timing, based on the clock signal CLK and data strobe signal DQS transmitted from the preprocessor 310, and transmit the generated strobe signal to the command/address signal capturer 332 and the data capturer 333.

The strobe generator 331 may detect rising and falling edges of the clock signal stored in a buffer 331a, and generate a clock strobe signal CLK_STB(k) at each detected rising and falling edge.

Figure 7:
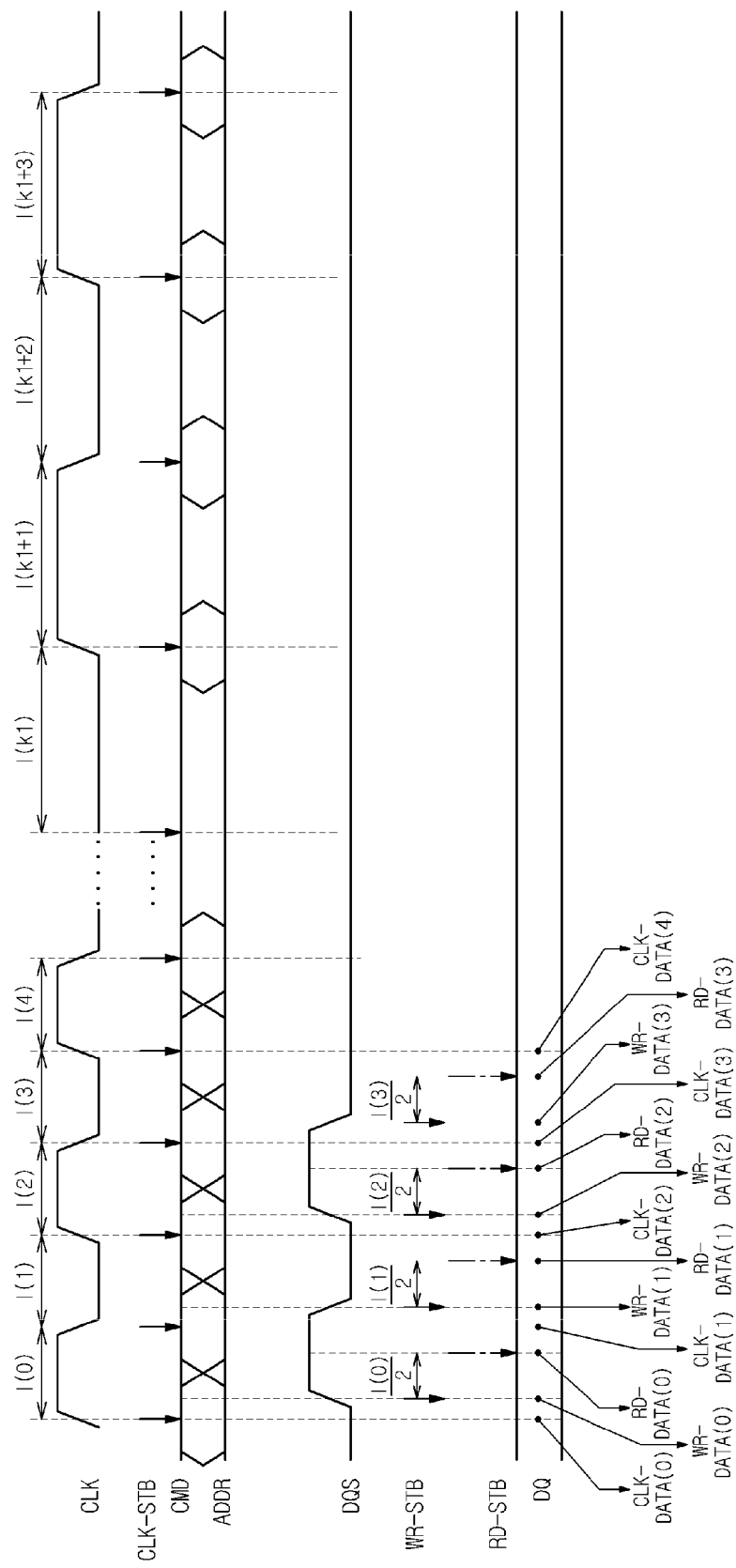
FIG. 7 is a timing diagram illustrating an example of signal processing in the logic value capturer and control signal generator shown in FIG. 6.

FIG. 7 is a timing diagram illustrating an example of signal processing in the logic value capturer and control signal generator shown in FIG. 6. Referring to FIG. 7, each clock strobe signal CLK_STB may be generated with a timing based on, or in synchronization with, each rising and falling edge of the clock signal CLK.

In addition, the strobe generator 331 may detect rising and falling edges of the data strobe signal DQS, and generates a read strobe signal RD_STB(k) and a write strobe signal WR_STB(k) using the detected rising and falling edges and an interval I(k) measured by the time interval measurer 320.

For example, the strobe generator 331 generates a write strobe signal WR_STB(k) at every detected rising and falling edge of the data strobe signal DQS. For example, the write strobe signal WR_STB(k) is generated with a timing based on, or in synchronization with, each edge of the data strobe signal DQS.

In addition, the strobe generator 331 may generate a read strobe signal RD_STB(k) at each position delayed by a certain period from each generated write strobe signal WR_STB(k).

The strobe generator 331 may check the interval of the clock signal CLK to which the generation time point of each write strobe signal WR_STB(k) belongs, and generate a read strobe signal RD_STB(k) using a value of the checked interval. For example, the strobe generator 331 may check the value of the interval to which the write strobe signal WR_STB(k) belongs, and generate a read strobe signal RD_STB(k) at each position delayed by a half of the checked interval from the position of each write strobe signal WR_STB(k). For example, a phase difference of 90° may exist between the write strobe signal WR_STB(k) and the read strobe signal RD_STB(k).

Referring to FIG. 7, the strobe generator 331 may generate write strobe signals WR_STB(0) to WR_STB(3) for every rising and falling edge of each data strobe signal. In addition, the strobe generator 331 may determine the write strobe signal WR_STB(0) to be positioned within an interval I(0), and generate a read strobe signal RD_STB(0) at the position delayed by I(0)/2 from the write strobe signal WR_STB(0). By repeating this procedure, read strobe signals RD_STB(0) to RD_STB(3) may be generated.

The command/address signal capturer 332 may receive the clock strobe signal CLK_STB(k) from the strobe generator 331, detect respective logic values CMD(k) and ADDR(k) of the command signal and an address signal for every position of the clock strobe signal CLK_STB(k), and transmit the detected logic values to a memory. In addition, the command/address signal capturer 332 may transmit the detected logic value CMD(k) of the command signal to the control signal generator 340.

The data capturer 333 may extract logic values of an interface signal using at least one of the strobe signals transmitted from the strobe generator 331 in accordance with specifications of the semiconductor device, and select any one from among the extracted logic values.

For example, the data capturer 333 may receive the clock strobe signal CLK_STB(k), read strobe signal RD_STB(k) and write strobe signal WR_STB(k) from the strobe generator 331, detect a logic value of the data signal DQ for every position of each strobe signal, and transmit the detected logic value to a memory.

Meanwhile, the data capturer 333 may further include a multiplexer MUX 333c to select any one from among the data logic values detected for every position of each strobe signal and transmit the selected data logic value to the memory. The multiplexer MUX 333c may be controlled by operating signals RD_FLAG(k) and WR_FLAG(k) transmitted from the control signal generator 340. For example, the multiplexer MUX 333c may transmit a logic value RD_DATA by the read strobe signal RD_STB(k) to the memory when the read signal RD_FLAG is transmitted, and transmits a logic value WR_DATA by the write strobe signal WR_STB(k) when the write signal WR_FLAG is transmitted. In addition, when neither the operating signal RD_FLAG(k) nor WR_FLAG(k) is transmitted, a logic value CLK_DATA by the clock strobe signal CLK_STB(k) may be transmitted to the memory.

In the meantime, the logic value RD_DATA is expected data to be compared with the value output from a DUT during a DUT test, and may be stored in a batch at the time after a predetermined or reference sequence number from the sequence number where a read command is generated, instead of being stored whenever each logic value RD_DATA is captured.

The operating signal generator 341 of the control signal generator 340 may analyze a logic value of a command signal transmitted from the command/address signal capturer 332, and generate an operating signal RD_FLAG/WR_FLAG which indicates whether the command is a read command or a write command for every sequence number.

The input/output enable signal generator 342 may generate the DRE signal which is, for example, information regarding effective timing to output data to the DUT from the test device. The DRE signal is the same as the write signal WR_FLAG(k).

In addition, the input/output enable signal generator 342 generates the CPE signal, which is, for example, information regarding effective timing to compare response data transmitted from the DUT and expected data. The input/output enable signal generator 342 may generate the CPE signal based on the read signal RD_FLAG(k), a burst value set in a mode resistor set (MRS) when a write command is applied, and a data mask (DM) signal. For example, the CPE signal may be generated by reflecting only the read signal RD_FLAG(k) for the DRAM cell address where data are stored after performing an actual write operation.

The event checker 350 may determine whether a pulse signal is transmitted from the event generator 200, and generate event information data including the generation time point of the pulse signal and a type of an event.

For example, when an event is determined to have occurred, the event checker 350 may check the sequence number of a clock signal at which the event has occurred, and transmit, to the communication interface 360, event information data which is information regarding the sequence number of the occurrence time of the checked event and the type of the event.

The communication interface 360 may communicate with a data communication link such that timing data generated by the time interval measurer 320, logic value data captured by the logic value capturer 330, an input/output enable signal generated by the control signal generator 340 and event information data may be transmitted to the storage server or test device.

The thus-configured pattern synthesis apparatus 300 may be connected to a controller via a user interface (UI). The controller may set parameters of the pattern synthesis apparatus 300, and control and monitor the overall operation of the pattern synthesis apparatus 300.

Figure 8:
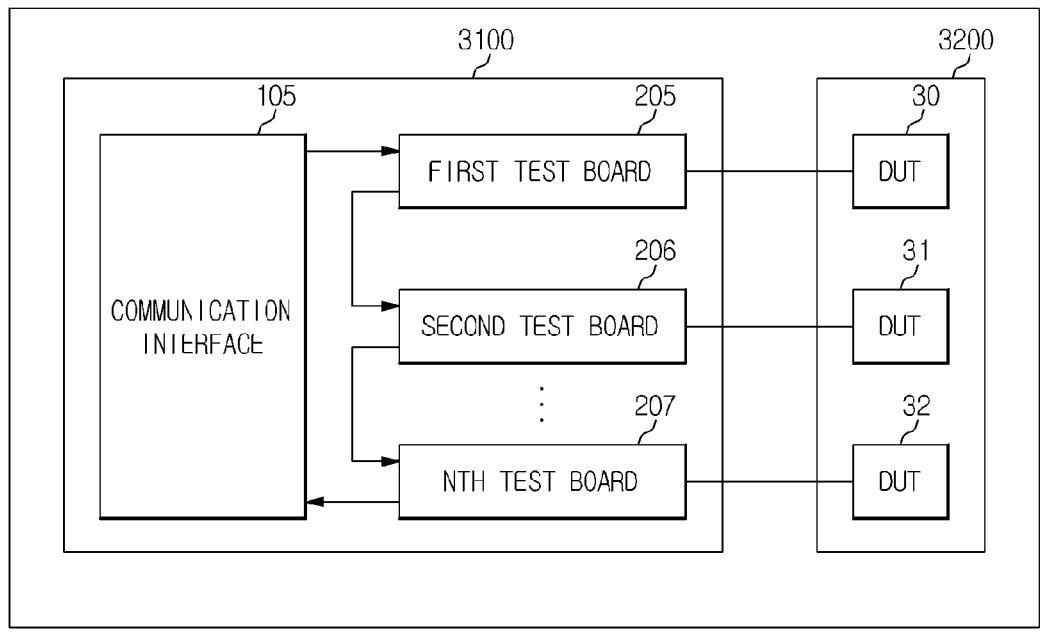
FIG. 8 is a block diagram schematically showing a configuration of a test system.

FIG. 8 is a block diagram schematically showing a configuration of a test system.

Referring to FIG. 8, a test device 3100 of the test system 3000 may communicate with a storage server (not shown) and a semiconductor device (DUT) 10.

The test device 3100 may receive test pattern data from the storage server via a communication interface 200, and perform a test on the semiconductor device 10 based on the transmitted test pattern data. Here, the test pattern data transmitted from the storage server may correspond to the specifications of the semiconductor device.

The test device 3100 may be connected to the first through third DUTs 30-32 via a device interface 3200. The device interface 3200 may include a board and a cable to apply signals output from the test device 3100 and power to an input pin and a power pin of each of the first through third DUTs 30-32, respectively, and transfer signals output from output pins of each of the first through third DUTs 30-32 back to the test device 3100.

The test device 3100 may include a communication interface 105, a plurality of first through third test boards 205-207 and a test controller (not shown).

The communication interface 105 may receive test pattern data in real time, and transfer the received data to the first through third test boards 205-207.

The first through third test boards 205-207 may transfer a test result (pass or fail) for each DUT to the test controller. Therefore, the first through third test boards 205-207 may test a plurality of DUTs individually, and may also test different semiconductor devices.

The first through third test boards 205-207 may be interconnected in a ring topology to enable communication therebetween. The mutual communication between the first through third test boards 205-207 may enable the plurality of DUTs 10 to be tested at the same time, thus being suited to mass production.

For example, a transmitter of the communication interface 105 may be connected to a receiver of the first test board to transmit test pattern data to the first test board. The test pattern data may then be transmitted to the second test board via a communication line which interconnects a transmitter of the first test board and a receiver of the second test board. When the test pattern data is transmitted to the nth test board in the above-described manner, the test pattern data may be retransmitted to the communication interface 105 via a communication line which interconnects a transmitter of the nth test board and a receiver of the communication interface 105.

The test controller (not shown) is connected to the plurality of first through third test boards 205-207 through a universal interface (UI) to change a DUT test method, a test result analyzing method, etc., as needed. In addition, the test controller may set operation parameters of each of the first through third test boards 205-207, and control and monitor the overall operation thereof.

Figure 9:
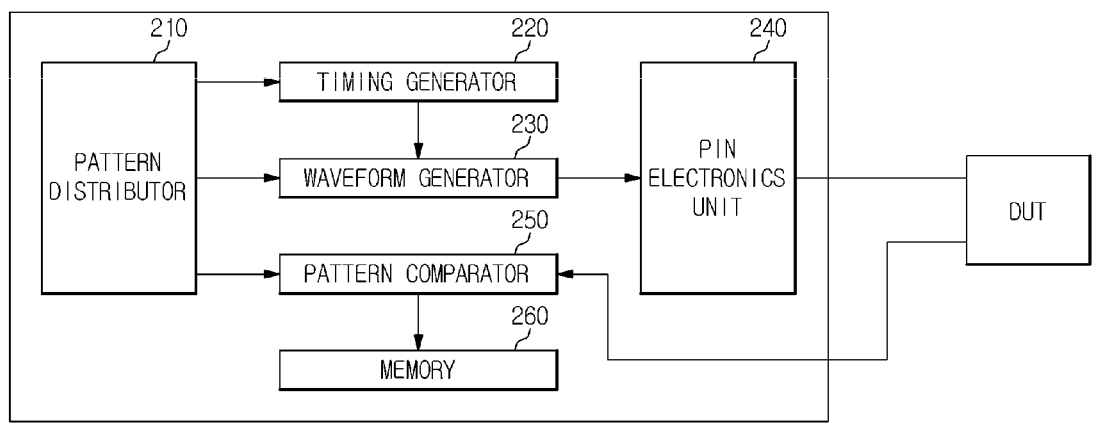
FIG. 9 is a block diagram showing a configuration of a test board in detail.

FIG. 9 is a block diagram showing a configuration of the first test board 205 in detail. The second and third test boards 206 and 207 may have the same configuration as that of the first test board 205 described below. Further the second and third DUTs 31 and 32 may have the same operation as that of the first DUT 30 described below.

In the example illustrated in FIG. 9, the first test board 205 includes a pattern distributor 210, a timing generator 220, a waveform generator 230, a pin electronics unit 240, a pattern comparer 250 and a memory 260.

The pattern distributor 210 may appropriately distribute each test pattern data stored in a buffer to components of the test board based on conditions set by the test controller.

For example, the pattern distributor 210 may transmit timing data to the timing generator 220, transmit logic value data and event information data to the waveform generator 230, and transmit a DRE signal to the pin electronics unit 240. In addition, the pattern distributor 210 may transmit expected value data and a CPE signal to the pattern comparer 250 so that pass or fail of the DUT may be determined through comparison between the expected data and data output from the DUT.

Meanwhile, the pattern distributor 210 may operate in two modes based on the conditions set by the test controller.

Figure 10:
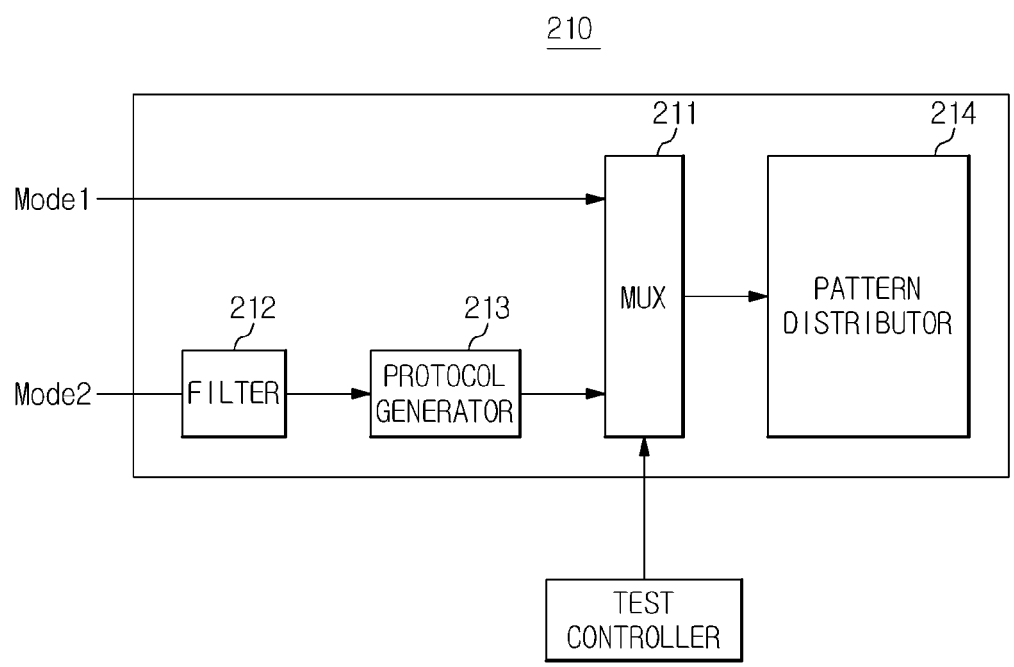
FIG. 10 is a block diagram showing a configuration of a pattern distributor in FIG. 9 based on operation modes thereof.

FIG. 10 is a block diagram showing a configuration of the pattern distributor 210 based on operation modes thereof. Referring to FIG. 10, the pattern distributor 210 may operate in a first mode Mode 1 and a second mode Mode 2 based on the configuration of the multiplexer 211 set by the test controller.

The pattern distributor 210 1 may transmit the received test pattern data directly to the respective components of the test board to configure an operation of the user device in the first mode Mode.

The pattern distributor 210 may analyze the transmitted test pattern data, and transmit recombined test pattern data to the components of the test board in the second mode Mode 2.

For example, in the second mode Mode 2, the pattern distributor 210 may include a filter 212 and a protocol generator 213.

The filter 212 may transmit only an effective signal which may be set or preset by the test controller to the protocol generator 213. For example, the filter 212 may transmit only a preset command signal and test pattern data associated with the command signal to the protocol generator 213. Thus, all of the test pattern data transmitted to the first through third test boards 205-207 may not be transmitted to the components of the test board, but instead, only effective test pattern data may be transmitted to the components of the test board.

The protocol generator 213 may recombine the command signal in accordance with a predetermined or reference format. In addition, a command signal set or preset by the test controller may be generated between the command signals. Here, the command signal set or preset by the test controller may be either a no-operation signal or a de-select signal. In addition, periodic refresh commands may be generated close to the timing of, or simultaneously with, the refresh commands in the test pattern data, or may be periodically generated in the protocol generator 213.

The timing generator 220 may receive timing data from the pattern distributor 210, and generate a timing signal including a clock signal and a data strobe signal to be output to the first DUT 30. The timing signal may be transmitted to the waveform generator 230, and used as a reference signal for a command signal, an address signal and a data signal.

The timing generator 220 may operate in two modes depending on the conditions set by the test controller.

Figure 11:
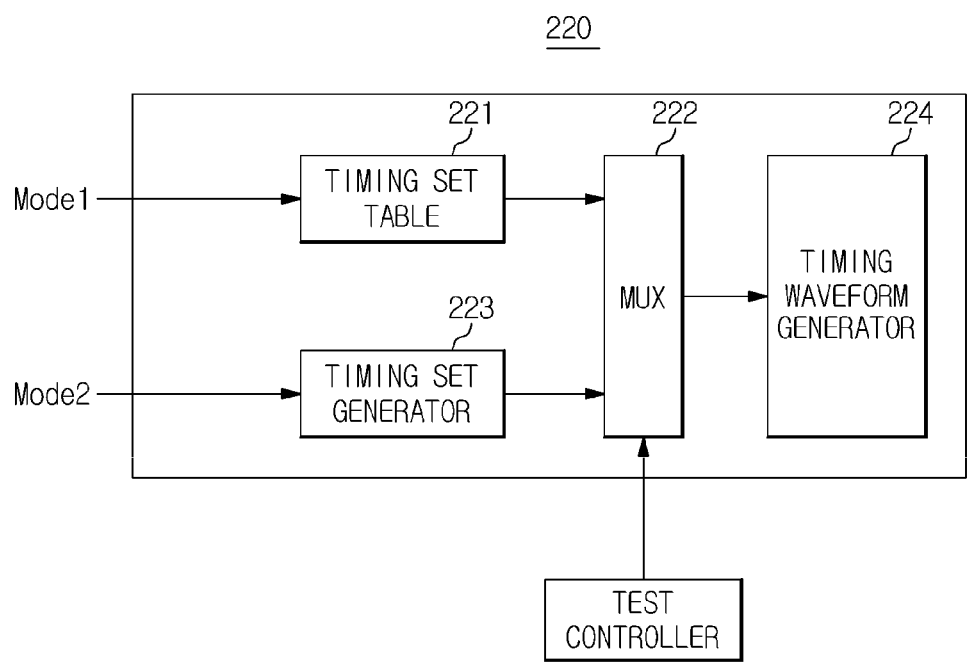
FIG. 11 is a block diagram showing a configuration of a timing generator in FIG. 9 based on operation modes thereof.

FIG. 11 shows the operation modes of the timing generator 220.

Referring to FIG. 11, the timing generator 220 may operate in the first mode Mode 1 and the second mode Mode 2 in accordance with a configuration of a multiplexer 222 set by the test controller. The timing generator 220 in the first mode Mode 1 may generate a timing signal using a pre-stored timing set table 221.

The timing generator 220 in the first mode Mode 1 includes the timing set table 221, and a timing waveform generator 224 which generates edges based on the data stored in the timing set table 221 to generate a timing signal.

The timing set table 221 may include a finite number of tables obtained as a result of pre-analysis of timing data, each of which stores, by indices, a timing set including information regarding a period of a timing signal and the positions of edges in the period.

For example, the timing generator 220 in the first mode Mode 1 may determine an index value based on the timing data transmitted from the pattern distributor and the type (clock signal, data strobe signal, etc.) of the timing signal to be generated, and may generate a timing signal based on the timing set data corresponding to the determined index value.

The timing generator 220 in the second mode Mode 2 may generate a timing signal based on the timing data, for each channel in the test boards and for each use of the semiconductor devices under test according to specifications of the semiconductor devices, such that positions of edges in the period may be adjusted in accordance with conditions set by a test controller.

For example, the timing generator 220 may generate a clock signal using the timing data transmitted from the pattern distributor 210 as it is, and generate a timing signal other than the clock signal, using the timing data and control data. Here, the control data may be set or preset by the test controller based on the type of the timing signal, and may be information regarding the positions of edges in the period for each type of the timing signals.

For example, the timing generator 220 in the second mode Mode 2 may include a timing set generator 223 to generate a timing set using the timing data and control data, and a timing waveform generator 224 to generate edges based on the generated timing set to generate a timing signal.

The timing set generator 223 may generate information regarding a period and positions of edges in the period in real time according to the type (clock signal, data strobe signal or the like) of the timing signal, and transmit the generated information to the timing waveform generator 224.

For example, for a clock signal, a timing set may be generated based on information regarding an interval value of timing data and the sequence number of the interval. For any signal other than the clock signal, a timing set may be generated in which a period is the same as that of the clock signal but the positions of edges in the period are calculated in real time based on the control data. For example, a timing set having information regarding different positions of edges may be generated based on control data even when the same timing data is input.

Figure 12:
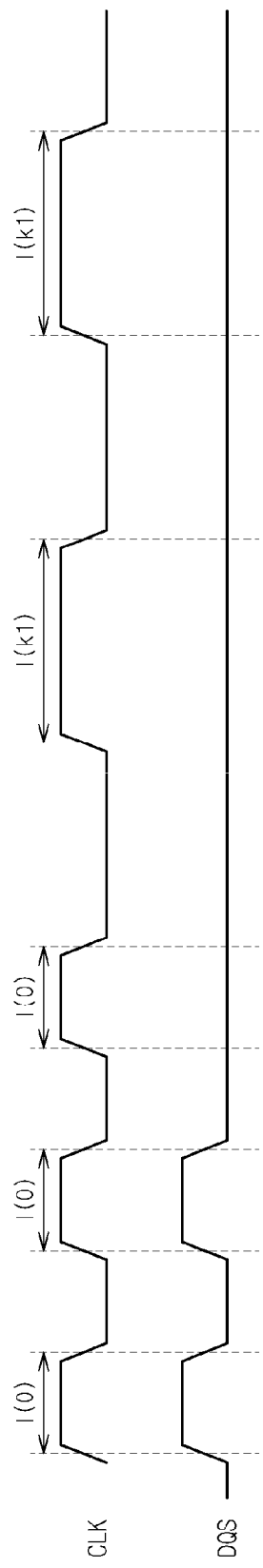
FIG. 12 is a timing diagram illustrating an example of a timing signal generated by the timing generator.

FIG. 12 shows a timing signal generated by the timing generator in the first mode Mode 1 or the second mode Mode 2.

Referring to FIG. 12, the clock signal CLK has a waveform generated based on values of intervals I(0) and I(k1) of timing data and sequence numbers 0 and k1 of the intervals. For example, if timing data received from the pattern distributor 210 are intervals I(0) and I(k1), interval values corresponding to the interval sequence numbers between sequence numbers 0 and k1 are the same as the interval I(0), and interval values corresponding to the interval sequence numbers k1 and after k1 are the same as the interval I(k1).

In the example illustrated in FIG. 12, the data strobe signal DQS is generated with a timing based on, or in synchronization with, the clock signal CLK, however, it is to be understood that the scenario depicted in FIG. 12 is merely exemplary, and according to example embodiments of the inventive concepts, positions of edges in one period may be different from those of the clock signal CLK even when the period of the data strobe signal DQS is the same as the period of the clock signal CLK.

The waveform generator 230 may output a driving signal waveform using the logic value data transmitted from the pattern distributor 210 and the timing signal transmitted from the timing generator 220. For example, the waveform generator 230 may output a driving signal waveform corresponding to the logic value data based on, or in synchronization with, the timing signal.

The waveform generator 230 may generate a driving signal including a command signal, an address signal and a data signal based on information regarding a waveform configuration preset by the test controller.

For example, the command signal and the address signal may be generated such that an appropriate logic value may be latched at the rising and falling edges of the clock signal based on logic value data. Further, the command signal and the address signal may be generated such that a transition between high and low levels may be made at a center of the clock signal. Thus, the command signal and the address signal may be reconstructed as those generated in a user device, and applied to the DUT.

The data signal may be generated based on a data strobe signal in a duration where a write (WR) command is generated, and based on a clock signal in other durations.

For example, the waveform generator 230 may generate a test data signal such that the logic value corresponding to the data signal in logic value data is latched at rising and falling edges of each data strobe signal or clock signal. Further, the data signal may be generated such that a transition between high and low levels may be made at a center of the data strobe signal or clock signal. Thus, the data signal may be realized as those generated in a user device, and applied to the DUT.

Figure 13:
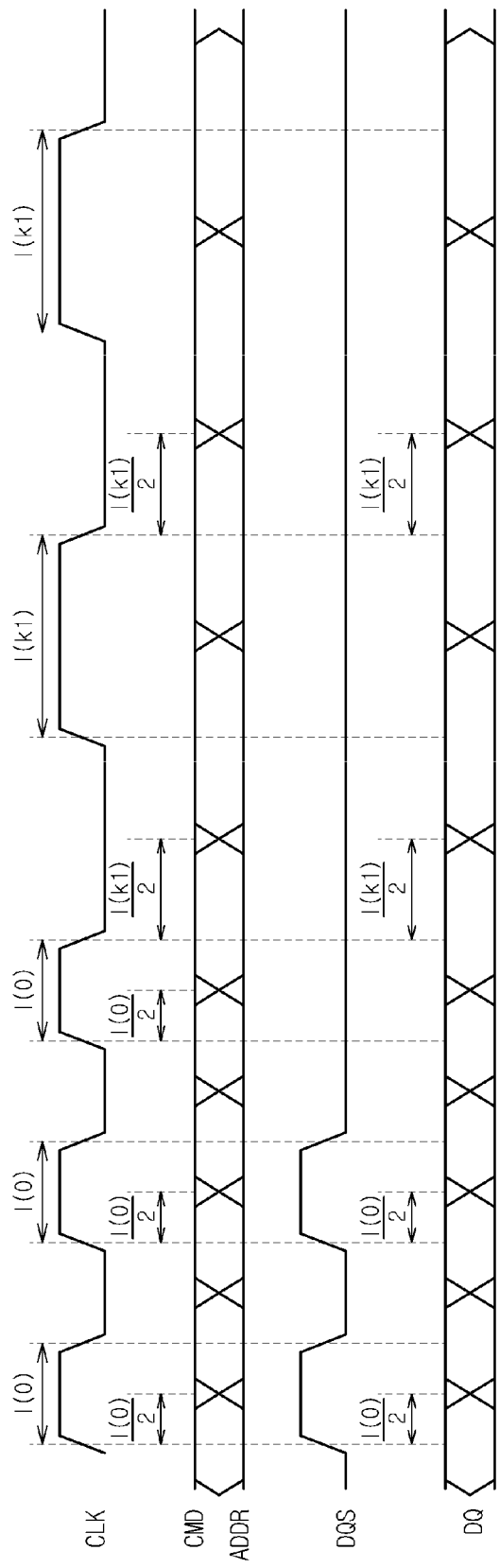
FIG. 13 is a timing diagram illustrating an example of a driving signal generated by a waveform generator shown in FIG. 9.

FIG. 13 shows the waveform of the driving signal generated by the waveform generator 230 as described above.

Referring to FIG. 13, a driving signal including a command signal CMD, an address signal ADDR and a data signal DQ may be generated such that appropriate logic values may be latched in accordance with timing signals CLK and DQS transmitted from the timing generator 220.

For example, the waveform generator 230 may generate a command signal CMD and an address signal ADDR each having a high or low level such that logic values of the command signal CMD and address signal ADDR may be latched at each of the edges of the clock signal CLK. Further, a transition between the high level and the low level of each of the command signal CMD and address signal ADDR may be made at centers (I(0)/2 and I(k1)/2) of the clock signal CLK.

In addition, the waveform generator 230 may generate the data signal DQ such that a logic value of data may be latched at each edge of the data strobe signal DQS. Further, the waveform generator 230 may generate a data signal having a logic value corresponding to each edge of the clock signal CLK in a duration in which the data strobe signal DQS is not generated.

The pin electronics unit 240 may convert the driving signal transmitted from the waveform generator 230 to have a voltage level (i.e., physical signal) recognizable by the first DUT 30, and transmit the converted signal with the voltage level to the first DUT 30. The signal with the voltage level may be a test driving signal to test the first DUT 30.

The pin electronics unit 240 may extract a logic value from the DUT response signal transmitted from the first DUT 30, and transmit the extracted logic value to the pattern comparer 250.

The pin electronics unit 240 may output the test driving signal in accordance with the DRE signal serving as an input/output enable signal, instead of constantly outputting the test driving signal to the first DUT 30. The pin electronics unit 240 may output the test driving signal to the first DUT 30 only at the activated time (high level) of the DRE signal.

The pattern comparer 250 may determine pass or fail of the DUT using the expected data and CPE signal transmitted from the pattern distributor 210 and the logic value of the DUT response signal transmitted from the pin electronics unit 240. The pattern comparer 250 may determine whether the CPE signal is activated (high level), compare the logic value of the DUT response signal and expected data when the CPE signal is activated, and determine the DUT as fail if the logic value does not correspond to the expected data.

Figure 14:
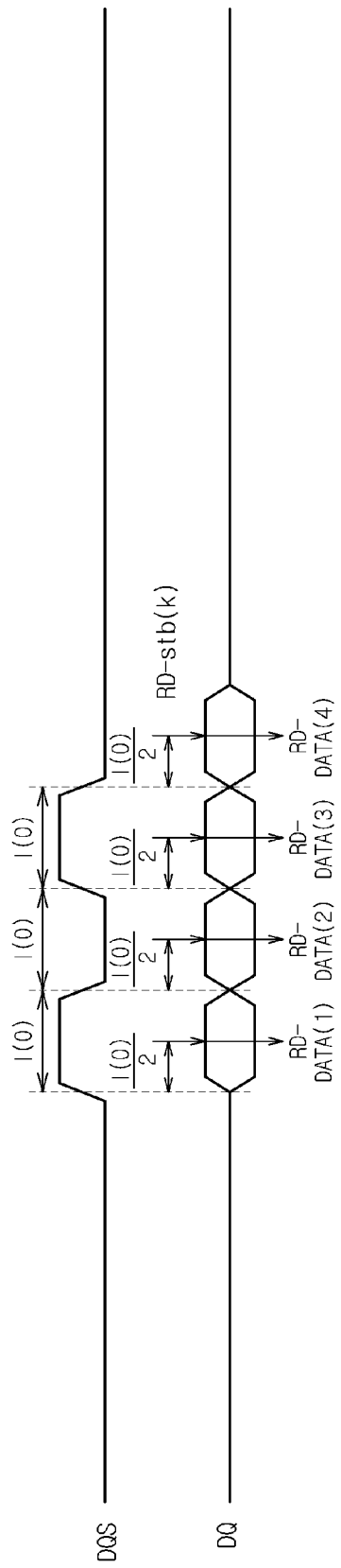
FIG. 14 is a timing diagram illustrating an example of a device under test (DUT) response signal output from the DUT when a test driving signal based on the driving signal generated in FIG. 13 is applied to the DUT.

FIG. 14 is a timing diagram illustrating an example of a DUT response signal output from the DUT when a test driving signal based on the driving signal generated in FIG. 13 is applied to the DUT.

Referring to FIG. 14, the pattern comparer 250 may compare logic values of the data strobe signal DQS and the data signal DQ of the DUT response signal and expected data when the CPE signal is activated.

For example, the pattern comparer 250 may latch logic values RD_DATA1 to RD_DATA4 of the data signal DQ at the center of the data strobe signal DQS transmitted from the DUT, and determine whether the logic values RD_DATA1 to RD_DATA 4 correspond to the relevant expected data.

A memory 260 stores DUT test results. For example, the memory 260 may store the relevant logic value, expected data and the sequence number of the clock signal, corresponding to the expected data when a pattern comparer 250 determines the DUT as fail.

By analyzing records of fail and information on the fail thus-stored in the memory 260, DRAM cell access information corresponding to a moment of failure may be obtained.

Now, processes of generating test pattern data using the above-described semiconductor test system and testing the DUT using the generated test pattern data will be explained in detail.

Figure 15:
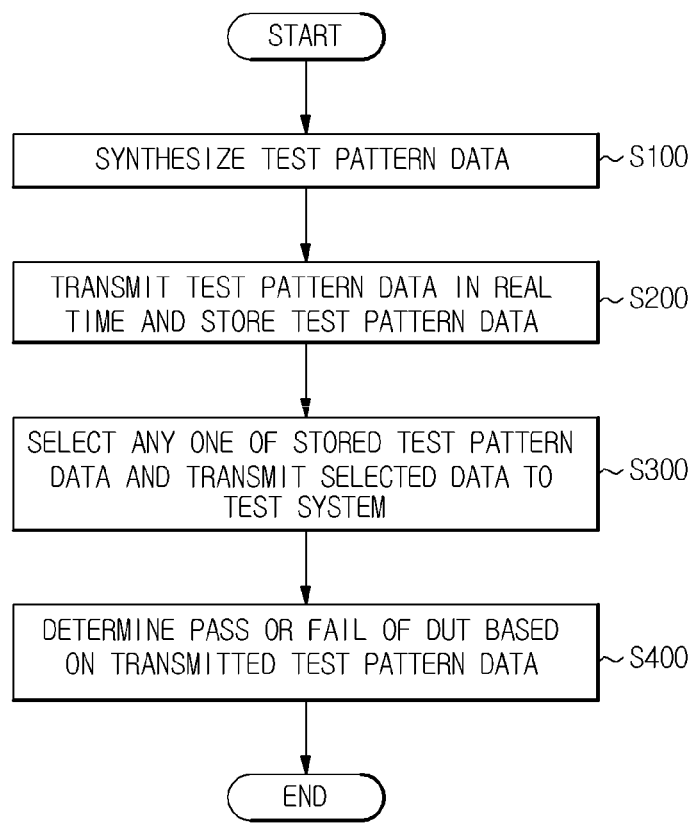
FIG. 15 is a flowchart schematically illustrating a semiconductor test method according to example embodiments of the inventive concepts.

FIG. 15 is a flowchart schematically illustrating a semiconductor test method according to example embodiments of the inventive concepts.

Referring to FIG. 15, in step S100, test pattern data may be synthesized in a pattern capture system of a semiconductor test system. The test pattern data is a signal to be applied to a DUT in the semiconductor test system. The test pattern data may be generated by analyzing a timing signal from an interface signal output from a user device, and capturing a logic value of each interface signal based on the timing signal. The test pattern data generation process will be explained in greater detail with reference to FIGS. 16 to 18.

In step S200, the generated test pattern data may be transmitted to a storage server via a data communication link and stored in the storage server.

In step S300, the stored test pattern data may be selected depending on the DUT in the test system, and transmitted to the test system via the data communication link.

In step S400, the test system may generate a test driving signal using the received test pattern data, apply the test driving signal to the DUT, and determine pass or fail of the DUT based on a DUT response signal.

According to example embodiments of the inventive concepts, the test driving signal which is a realization of an interface signal for a user device may be applied to the DUT, thereby enabling a mounting-type test.

Figure 16:
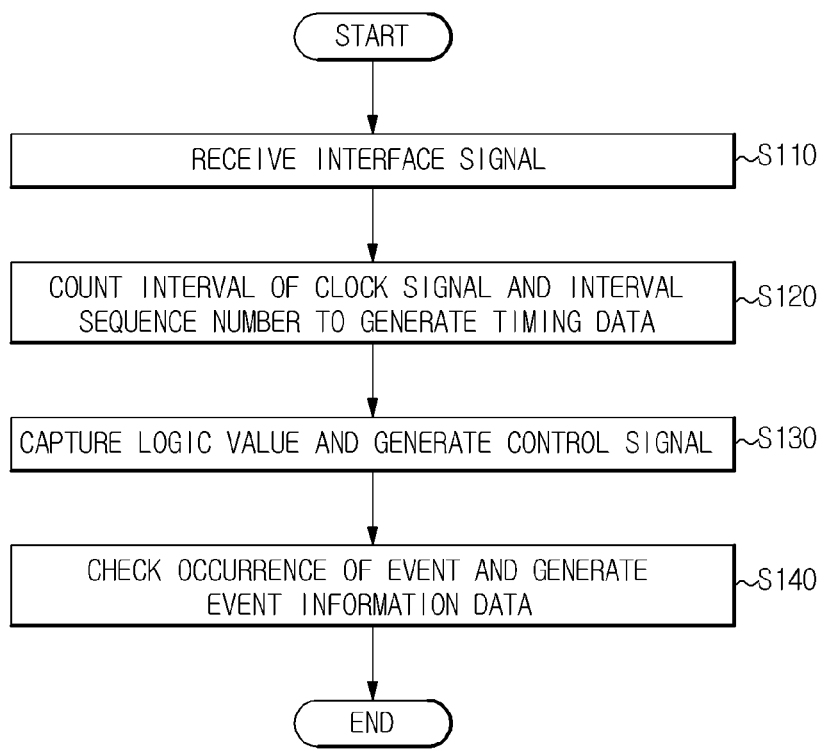
FIG. 16 is a flowchart illustrating a test pattern data generation process shown in FIG. 15.
Figure 17:
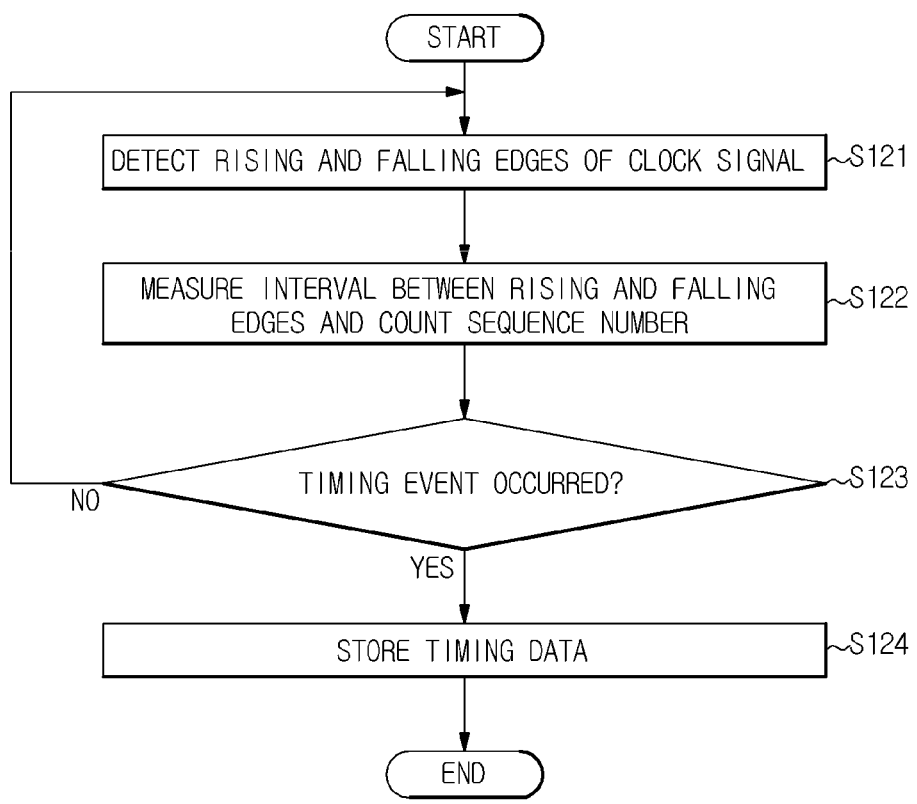
FIG. 17 is a flowchart illustrating a timing data generation process shown in FIG. 16 in detail.
Figure 18:
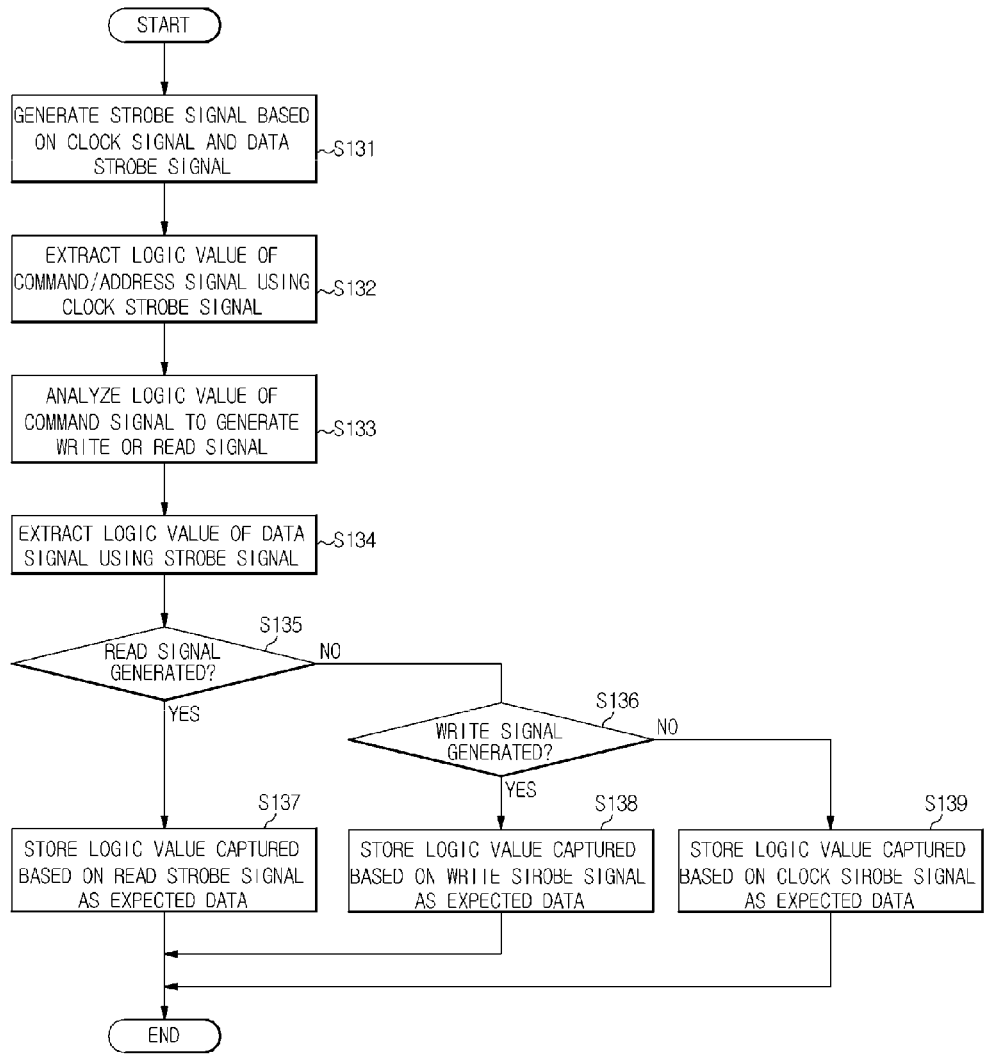
FIG. 18 is a flowchart illustrating a logic value capture process shown in FIG. 16 in detail.

FIG. 16 to FIG. 18 are flowcharts illustrating the test pattern data generating process shown in FIG. 15 in detail.

FIG. 16 is a flowchart illustrating a test pattern data generation process shown in FIG. 15. Referring to FIG. 16, in step S110, the pattern synthesis apparatus may receive an interface signal for driving a semiconductor device of the user device through a probe connected to the semiconductor device. According to example embodiments of the inventive concepts, the semiconductor device may be a memory device including for example DRAM or the like. The thus-received interface signal may be amplified, converted into a digital signal, and temporally aligned by a preprocessor. The preprocessor may transmit a clock signal of the thus-preprocessed interface signal to a time interval measurer.

In step S120, the time interval measurer may measure an interval of the clock signal, and counts an interval sequence number so as to generate timing data.

FIG. 17 is a flowchart illustrating a timing data generation process shown in FIG. 16 in detail;

Referring to FIG. 17, in step S121, an edge detector of the time interval measurer detects rising and falling edges of the clock signal.

In step S122, when edges are detected, a timing data generator may measure an interval between a rising edge and a falling edge, the rising edge and the falling edge being adjacent to each other, and count an interval sequence number indicating which interval of the clock signal corresponds to the measured interval. The timing data generated by the timing data generator may be composed of the measured interval and relevant interval sequence number.

In step S123, a timing event checker may determine, based on the generated timing data, whether a timing event in which a frequency or a duty ratio has changed has occurred. For example, the timing event checker may calculate a period based on the measured interval, and determine the timing event to have occurred when a difference between the calculated period and a reference period exceeds a predetermined or reference threshold value.

According to example embodiments of the inventive concepts, the reference period may be calculated through intervals of the most recently stored timing data.

In addition, the timing event checker may calculate a duty ratio based on a ratio of the interval value of the high level to the interval value of the low level in one period, and determine the timing event to have occurred if a difference between the calculated duty ratio and a previous duty ratio exceeds a predetermined or reference threshold value.

If, in step S123, the timing event determines that the frequency or duty ratio has changed, in step S124, timing data corresponding to the occurrence of change may be stored in a memory. For example, the semiconductor test method according to example embodiments of the inventive concepts may store only the timing data corresponding to an occurrence time of a timing event and transmit the stored data, thereby reducing a quantity of stored data.

Returning to FIG. 16, when the timing data are generated in step S120, in step S130 a logic value capturer may capture a logic value of the interface signal based on a timing signal. According to example embodiments of the inventive concepts, the interface signal may be a command/address signal and a data signal, and the timing signal may be a timing-related signal including for example a clock signal, a data strobe signal, etc.

For example, the logic value capturer may capture logic values of the command/address signal and data signal based on the clock signal and data strobe signal. In addition, a control signal generator may analyze the captured command signal to generate a read or write signal, and generate an input/output enable signal (DRE, CPE) based on the generated read or write signal.

FIG. 18 is a flowchart illustrating a logic value capture process shown in FIG. 16 in detail.

Referring to FIG. 18, in step S131, a strobe generator of the logic value capturer may generate a strobe signal based on the clock signal and data strobe signal, and transmit the generated signal to a command/address signal capturer and to a data capturer so as to capture a driving signal.

The strobe signal may be, for example, information regarding a reference timing to capture a logic value, and may include a clock strobe signal, a write strobe signal and a read strobe signal.

The clock strobe signal may be generated at every rising and falling edge of the clock signal, and the write strobe signal may be generated at every rising and falling edge of the data strobe signal.

The read strobe signal may be generated based on the rising and falling edges of the data strobe signal and timing data generated by the time interval measurer. For example, the strobe generator may detect rising and falling edges of the data strobe signal, and check the interval of the clock signal to which each edge belongs. In addition, the strobe generator may generate the read strobe signal at each position delayed by a half of the relevant interval from each edge.

In step S132, the command/address signal capturer may capture a logic value of a command/address signal using the strobe signal. The command/address signal capturer may latch the logic value of the command/address signal based on the clock strobe signal synchronized with the rising and falling edges of the clock signal. For example, the command/address signal capturer may determine whether the command/address signal corresponding to the generation time point of the clock strobe signal is a high level or a low level, and latch a logic value of '1' if a high level and latch a logic value of '0' if a low level.

The thus-captured command signal may be transmitted to the control signal generator, and, in step S133, the control signal generator may analyze the logic value of the command signal so as to generate a read signal or a write signal, and transmits the generated read or write signal to the data capturer.

In step S134, the data capturer may extract a logic value of the data signal by capturing the logic value using the strobe signal. The data capturer may capture the logic value of the data signal based on the clock strobe signal, write strobe signal and the read strobe signal.

In steps S135-S139, the data capturer may select the captured logic value based on the operating signal generated by the control signal generator. For example, if in step S135 a read signal is generated, in step S137, the data capturer may store a logic value captured based on the read strobe signal in a memory as expected data. If a read signal is not generated in step S135, the method may proceed to step S136. If, in step S136, a write signal is generated, in step S138 the data capturer may store a logic value captured based on the write strobe signal in the memory as expected data. In addition, if, in step S136, no operating signal is generated, in step S139, the data capturer may store a logic value captured based on the clock strobe signal in the memory.

An event checker may determine whether an event has occurred when logic value data and control signal data are generated, and may generate event information data including a sequence number of the clock signal corresponding to the generation time point of the event and a type of the event.

Test pattern data including the thus-generated timing data, logic value data, input/output enable signal and event information data may be transmitted to the test system and used in a DUT test.

Processes of the DUT test will be described in greater detail below. An address signal, which may be an address value of a memory cell for data storage, and a test driving signal synchronized with the data strobe signal may be applied to the DUT with a timing based on, or in synchronization with, the clock signal restored through the timing data when an output enable signal DRE is activated, and stored in a memory cell designated by a relevant address.

When a read command is applied from the test driving signal, an operation of comparing the logic value of the DUT response signal output from the memory cell and an expected value included in the test pattern data may be performed, and pass or fail of the DUT may be determined in accordance with a comparison result.

Now, a test pattern data restoration process and a process of determining pass or fail of the DUT using the data output when the test pattern data is applied will be explained with reference to FIG. 19.

Figure 19:
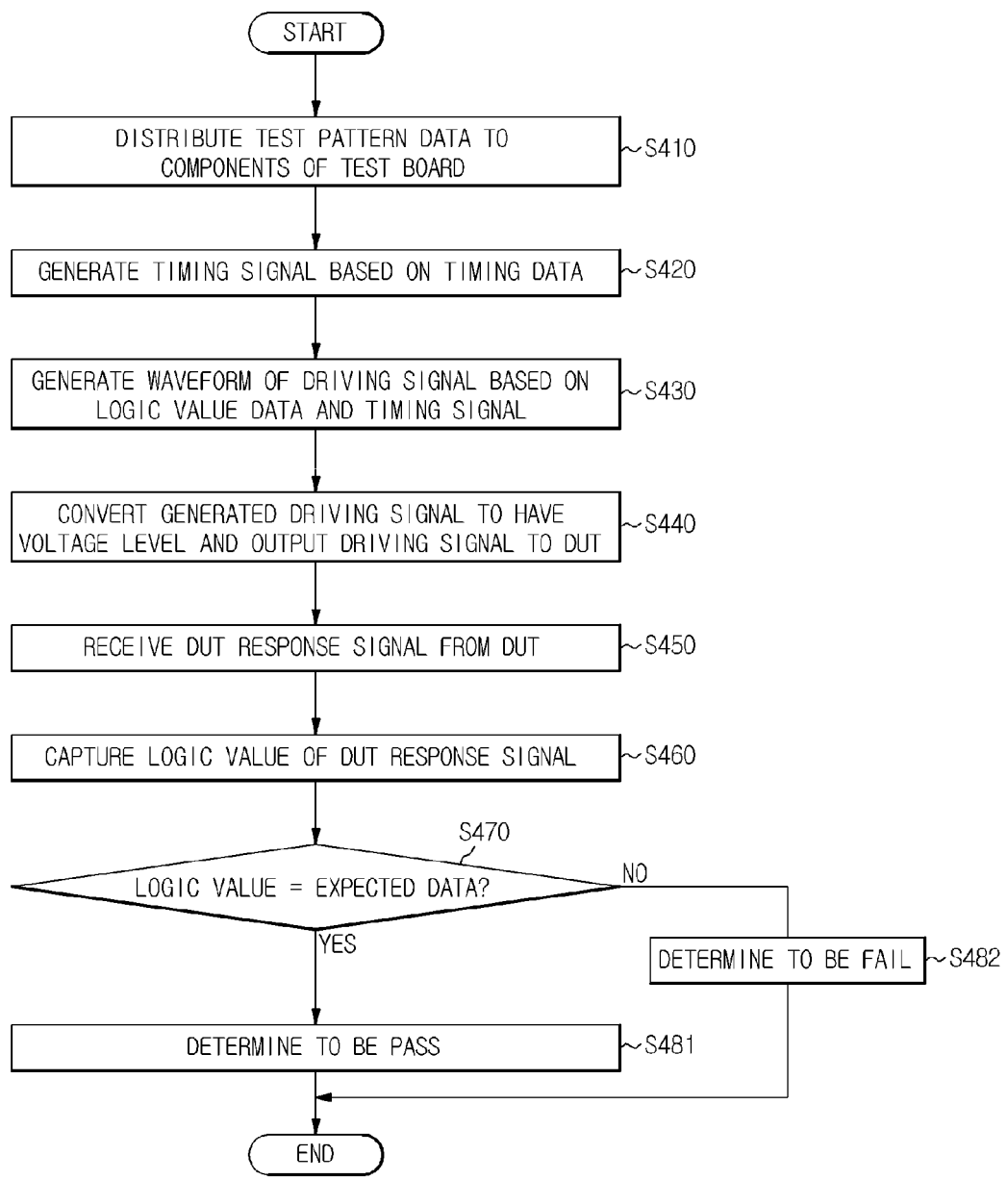
FIG. 19 is a flowchart illustrating a semiconductor test process shown in FIG. 15 in detail.

FIG. 19 is a flowchart illustrating the semiconductor test process in FIG. 15 in detail.

Referring to FIG. 19, in step S410, a pattern distributor may appropriately distribute the test pattern data to modules of a test board. For example, timing data may be transmitted to a timing generator, logic value data is transmitted to a waveform generator, and the DRE signal is transmitted to a pin electronics unit. In addition, the pattern distributor may transmit expected data and a CPE signal to the pattern comparator.

When the test pattern data are distributed in step S410, in step S420 the timing generator may generate a timing signal including for example a clock signal, a data strobe signal or the like, based on the interval and interval sequence number based on the timing data.

A timing signal other than the clock signal may be generated to have a period based on or identical to the period of the clock signal, but with different positions of edges in the period.

When the timing signal is generated in step 420, in step S430 the waveform generator may generate a driving signal waveform synchronized with the timing signal. For example, the waveform generator may generate the driving signal waveform such that logic values corresponding to logic value data may be latched at the respective edges of the timing signal.

The driving signal may include a command/address signal and a data signal to be stored in the memory cell of the DUT, and in step S440 the test driving signal may be converted from the driving signal to have a voltage level by the pin electronics unit, and the converted signal may be output to the DUT whenever the DRE signal is activated.

In step S450, when the read command is applied to the DUT, a DUT response signal including a data strobe signal and a data signal synchronized with the data strobe signal may be transmitted from the DUT.

In step S460, the pattern comparator may capture a logic value from the data signal of the DUT response signal when the CPE signal is activated. In step S470, the pattern comparator may determine whether the captured logic value is identical to the expected data.

If, in step S470, the pattern comparator determines the logic value to be identical to the expected data, in step S481, the DUT may be determined to pass. If, in step S470, the logic value is not identical to the expected data, in step S482 the DUT is determined to be fail and relevant data is stored in a memory.

As described above, in the pattern synthesis apparatus, a test device and the semiconductor test system having the same, the period of the clock signal of the user device may be measured, and the clock signal of the user device may be reconstructed based on the measured period in the test device, thereby enabling an accurate simulation based on frequency variation. Thus, pass or fail of a semiconductor device may be determined based on frequency variation, and therefore, a wider range of a mounting-type test and greater test coverage may be provided.

In addition, a plurality of test boards may be interconnected into a ring topology to test a plurality of DUTs simultaneously, thus being suited to mass production.

In addition, a signal in the user device may be captured, test pattern data may be generated based on the captured signal, and DUTs may be tested based on the generated test pattern data, thereby enabling a mounting-type test.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor test system comprising:
   a user device configured to operate a reference device in accordance with an interface signal of the reference device based on a timing signal having a variable operating frequency;
   a pattern synthesis apparatus configured to measure an interval between adjacent ones of edges of the timing signal transmitted from the user device, and to extract a logic value of the interface signal in accordance with the timing signal so as to generate test pattern data; and
   a test device configured to receive the test pattern data, reconstruct the timing signal based on-the measured interval, generate a test driving signal such that a logic value of a response signal is extracted from a device under test (DUT) based on the reconstructed timing signal, and apply the test driving signal to the DUT so as to determine an operating state of the DUT,
   wherein the pattern synthesis apparatus includes
      a time interval measurer configured to measure the interval between the adjacent edges of the timing signal, and count a sequence number of the measured interval to generate timing data,
      the test device being configured to reconstruct the timing signal based on the timing data; and
      a logic value capturer configured to generate a strobe signal based the timing signal, and to extract the logic value of the interface signal in accordance with the strobe signal.

2. The semiconductor test system according to claim 1, wherein the time interval measurer is configured to determine, based on the measured interval, whether a timing event has occurred, and to store the timing data, the timing data including an interval and an interval sequence number corresponding to occurrence of the timing event.

3. The semiconductor test system according to claim 2, wherein the timing event includes any one of a frequency change or duty ratio change,
wherein the time interval measurer is configured to calculate a present period or a present duty ratio based on the interval, and to determine the timing event to have occurred if a difference between the present period or present duty ratio and a reference value exceeds a reference threshold value.

4. The semiconductor test system according to claim 3, wherein the reference value is a reference period or reference duty ratio calculated through an interval of most recently stored timing data, or a reference period or reference duty ratio calculated through an average of intervals measured from a most recent time where the timing data is stored to a present time.

5. The semiconductor test system according to claim 1, wherein the pattern synthesis apparatus further comprises:
a control signal generator configured to generate an operating signal based on the logic value of the interface signal, the operating signal including information on whether an operating command is a read command or a write command, and generate an input/output enable signal based on the operating signal, the input/output enable signal including information on effective input/output timing between the test device and the DUT.

6. The semiconductor test system according to claim 5, wherein,
the timing signal includes a clock signal and a data strobe signal, the data strobe signal being generated for a reference period according to the write command or the read command, and
the interface signal includes a data signal, a command signal and an address signal.

7. The semiconductor test system according to claim 6, wherein the logic value capturer comprises:
a strobe generator configured to generate the strobe signal based on the timing signal, the strobe signal including information regarding effective timing to capture the logic value of the interface signal;
a command/address signal capturer configured to extract logic values of the command signal and the address signal using the generated strobe signal; and
a data signal capturer configured to extract a logic value of the data signal using the generated strobe signal.

8. A pattern synthesis apparatus for generating test pattern data using an interface signal in a user device, the user device operating a reference device based on a timing signal having a variable operating frequency, the pattern synthesis apparatus comprising:
a time interval measurer configured to measure an interval between adjacent edges of the timing signal, and count a sequence number of the measured interval to generate timing data; and
a logic value capturer configured to generate a strobe signal based on the timing signal, and extract a logic value of the interface signal in accordance with the strobe signal.

9. The pattern synthesis apparatus according to claim 8, wherein the time interval measurer is configured to determine, based on the measured interval, whether a timing event has occurred, and store the timing data, the timing data including an interval and an interval sequence number corresponding to occurrence of the timing event.

10. The pattern synthesis apparatus according to claim 9, wherein the time interval measurer comprises:

an edge detector configured to detect rising and falling edges of a clock signal;
a timing data generator configured to measure an interval between the detected rising and falling edges, and to count a sequence number of the interval so as to generate timing data;
a timing event checker configured to determine, based on the interval, whether the timing event has occurred, the timing event changing the frequency or a duty ratio; and
a filter configured to filter the timing data if the timing event has not occurred.

11. The pattern synthesis apparatus according to claim 10, wherein the timing event checker is configured to calculate a present period or a present duty ratio based on the interval, and to determine the timing event to have occurred if a difference between the present period or present duty ratio and a reference value exceeds a reference threshold value.

12. The pattern synthesis apparatus according to claim 11, wherein the reference value' is a reference period or reference duty ratio calculated through an interval of most recently stored timing data, or a reference period or reference duty ratio calculated through an average of intervals, the intervals being measured from a most recent time when the timing data is stored to a present time.

13. The pattern synthesis apparatus according to claim 12, wherein the timing event checker is configured to store the average of intervals as timing data.

14. The pattern synthesis apparatus according to claim 8, further comprising:
a control signal generator configured to generate an operating signal based on the logic value of the interface signal, the operating signal including information on whether an operating command is a read command or a write command, and to generate an input/output enable signal based on the operating signal, the input/output enable signal including information on effective input/output timing between the test device and the DUT.

15. A semiconductor test system comprising:
a pattern synthesis apparatus configured to receive an interface signal from a reference semiconductor device, generate timing data by measuring intervals of a timing signal associated with the reference device, extract logic values from the interface signal, and generate test pattern data based on the extracted logic values; and
a test device configured to receive the test pattern data and the timing data, reconstruct the timing signal based on the timing data, generate a test driving signal based on the test pattern data and the reconstructed timing signal, apply the test driving signal to a device under test (DUT) to generate test output data, and to determine an operating state of the DUT based on the test output data and the extracted logic values,
wherein the pattern synthesis apparatus includes
a time interval measurer configured to measure a first interval between adjacent edges of the timing signal, and count a sequence number of the measured first interval to generate the timing data; and
a logic value capturer configured to generate a strobe signal based on the timing signal, and to extract the logic values of the interface signal in accordance with the strobe signal.

16. The semiconductor system of claim 15, further comprising:
a user device including a board, and the reference semiconductor device, the reference semiconductor device being mounted on the board, the interface signal being a signal sent between the board and the reference semiconductor device, the user device being configured to transmit the timing signal to the pattern synthesis device, the timing signal having a variable operating frequency.

17. The semiconductor system of claim 15, wherein, the extracted logic values include commands sent to the reference semiconductor device from the board, and data output from the reference semiconductor device, and the pattern synthesis device is configured to store the data output from the reference semiconductor device as expected data.

18. The semiconductor system of claim 17, wherein, the test device is configured such that determining the operating state of the DUT includes generating a comparison result based on the test output data and the expected data, and determining the operating state of the DUT based on the comparison result.

* * * * *